US012751013B2

(12) United States Patent
Shimomura et al.

(10) Patent No.: US 12,751,013 B2
(45) Date of Patent: Sep. 29, 2026

(54) SEMICONDUCTOR MEMORY DEVICE

(71) Applicant: Kioxia Corporation, Tokyo (JP)

(72) Inventors: Kenta Shimomura, Kuwana Mie (JP); Karin Takayama, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 374 days.

(21) Appl. No.: 18/595,331

(22) Filed: Mar. 4, 2024

(65) Prior Publication Data

US 2024/0324214 A1 Sep. 26, 2024

(30) Foreign Application Priority Data

Mar. 23, 2023 (JP) ................................ 2023-046553

(51) Int. Cl.
*H10B 43/27* (2023.01)

(52) U.S. Cl.
CPC .................................... *H10B 43/27* (2023.02)

(58) Field of Classification Search
CPC ................................ H10B 43/27; H10B 41/30
See application file for complete search history.

(56) References Cited

U.S. PATENT DOCUMENTS 10,147,736 B2 * 12/2018 Linuma .................. H10B 43/27
11,075,213 B2 * 7/2021 Noda ..................... H10B 41/20
2019/0067317 A1 2/2019 Shioda

FOREIGN PATENT DOCUMENTS

JP 2018142654 A 9/2018

* cited by examiner

*Primary Examiner* — Changhyun Yi
(74) *Attorney, Agent, or Firm* — Kim & Stewart LLP

(57) ABSTRACT

A semiconductor memory device includes a first conductive film, a semiconductor layer on the first conductive film, a stacked body having a plurality of conductive layers insulated from each other and stacked above the semiconductor layer in a stacking direction, a semiconductor film extending through the stacked body and the first conductive film in the stacking direction, an insulating film extending in the stacking direction between the plurality of conductive layers in the stacked body and the semiconductor film, and a second conductive film containing carbon, that is in direct contact with the first conductive film and with one end or a side surface of the semiconductor film.

18 Claims, 28 Drawing Sheets

SEMICONDUCTOR MEMORY DEVICE

CROSS-REFERENCE TO RELATED APPLICATION(S)

This application is based upon and claims the benefit of priority from Japanese Patent Application No. 2023-046553, filed Mar. 23, 2023, the entire contents of which are incorporated herein by reference.

FIELD

Embodiments described herein relate generally to a semiconductor memory device.

BACKGROUND

In a semiconductor memory device including a stacked body in which a plurality of conductive layers are stacked with an insulating layer interposed between them and a semiconductor film extending in a stacking direction in the stacked body, a plurality of memory cells are provided at a plurality of intersection positions at which the plurality of conductive layers and the semiconductor film intersect each other. It is desirable to improve operational reliability of the semiconductor memory device.

DETAILED DESCRIPTION

Embodiments provide a semiconductor memory device capable of improving operational reliability.

In general, according to one embodiment, there is provided a semiconductor memory device including a first conductive film, a semiconductor layer on the first conductive film, a stacked body having a plurality of conductive layers insulated from each other and stacked above the semiconductor layer in a stacking direction, a semiconductor film extending through the stacked body and the first conductive film in the stacking direction, an insulating film extending in the stacking direction between the plurality of conductive layers in the stacked body and the semiconductor film, and a second conductive film containing carbon, that is in direct contact with the first conductive film and with one end or a side surface of the semiconductor film.

A semiconductor memory device according to embodiments will be described in detail with reference to the accompanying drawings. The scope of the present disclosure is not limited to the embodiments.

First Embodiment

The semiconductor memory device according to a first embodiment includes a stacked body in which a plurality of conductive layers are stacked with an insulating layer interposed therebetween, and a semiconductor film that extends in a stacking direction in the stacked body, and a plurality of memory cells are provided at a plurality of positions at which the plurality of conductive layers and the semiconductor film intersect each other. The semiconductor memory device according to embodiments improve operational reliability.

Figure 1:
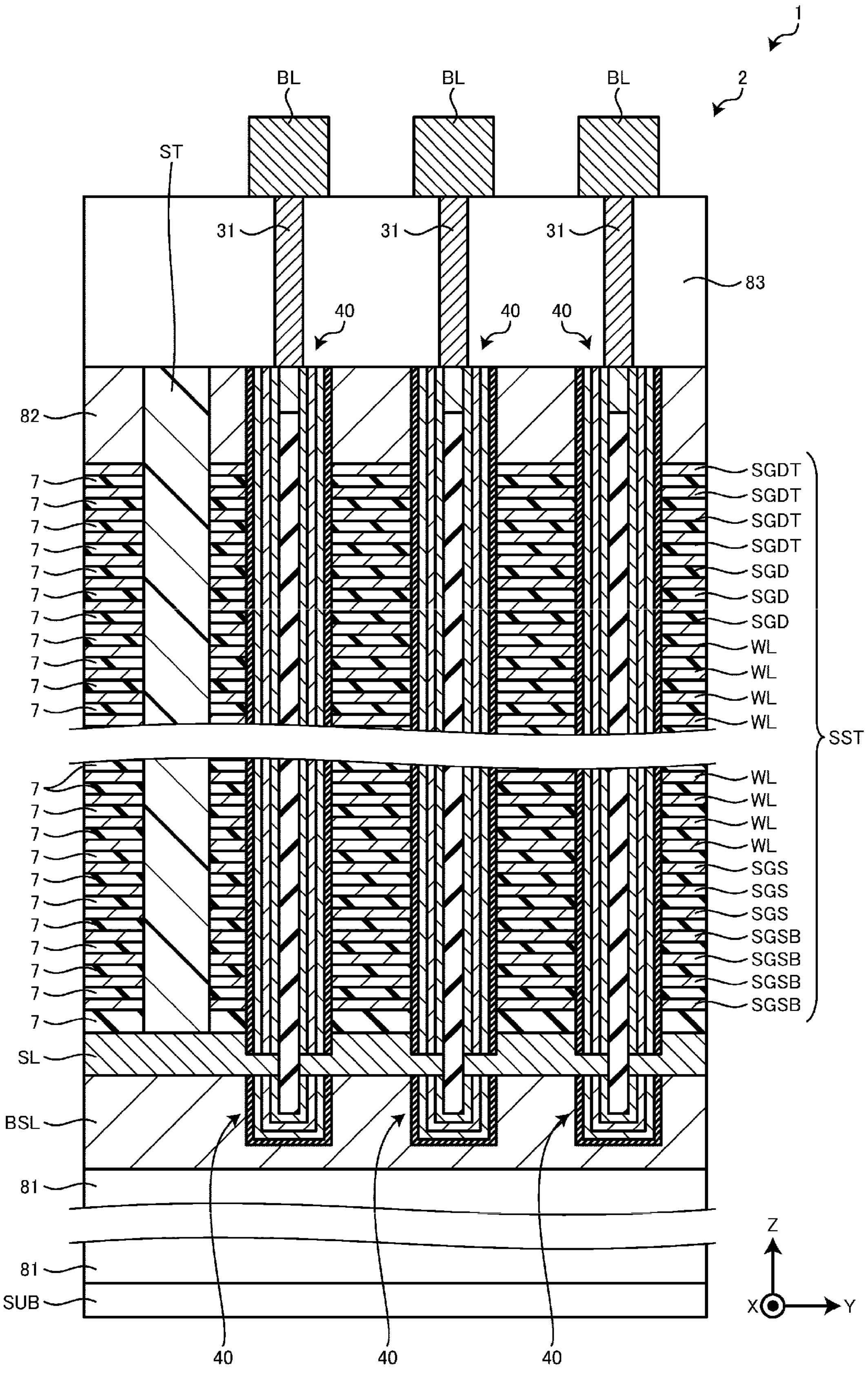
FIG. 1 is a cross-sectional view showing a configuration of a semiconductor memory device according to a first embodiment.

A semiconductor memory device 1 may be configured as shown in FIG. 1. FIG. 1 is a cross-sectional view showing a schematic configuration of the semiconductor memory device 1.

In the following description, directions orthogonal to each other in a plane parallel to a surface of a substrate SUB are referred to as an X direction and a Y direction, and more specifically, the X direction is a direction in which a word line WL extends, and the Y direction is a direction in which a bit line BL extends. A Z direction is a direction orthogonal to the surface of the substrate SUB. Therefore, the Z direction is orthogonal to the X direction and the Y direction.

As shown in FIG. 1, the semiconductor memory device 1 includes select gates SGS and SGSB, word lines WL, and select gates SGDT and SGD. The select gates SGS are stacked on a source line SL with an insulating layer 7 interposed therebetween. In the example of FIG. 1, the select gate SGSB is provided with four layers, and the select gate SGS is provided with three layers. The word lines WL are stacked on an uppermost layer of the select gate SGS with the insulating layer 7 interposed therebetween. In the example of FIG. 1, the word lines WL are stacked alternately with a plurality of insulating layers 7 in the Z direction. The select gates SGD are stacked on an uppermost layer of the word line WL through the insulating layer 7 interposed therebetween. The select gates SGSB and SGS, the word lines WL, and the select gates SGD and SGDT each have a plate shape extending in the X direction and the Y direction.

In the example of FIG. 1, the select gates SGDT and SGD, the word lines WL, and the select gates SGS and SGSB are divided and insulated in the Y direction by a slit ST. The source line may have a two-layer structure. The two-layer structure includes a stack of a source line BSL and the source line SL. The source line BSL and the source line SL are sequentially stacked on a +Z side of the substrate SUB having an interlayer insulating film 81 thereon. The source line BSL is in contact with a −Z side surface of the source line SL in order to reduce the resistance of the source line SL. The slit ST is provided on the +Z side of the source line SL and extends in the X direction and the Z direction.

The select gate SGD is divided in the Y direction by, for example, a dividing film SHE (not shown). The dividing film SHE is provided above (on the +Z side) the word lines WL and extends in the X direction and the Z direction.

The substrate SUB is, for example, a silicon substrate. The select gates SGS, the word lines WL, and the select gates SGD are, for example, metal layers containing tungsten (W). The insulating layers 7 and the interlayer insulating film 81 are, for example, insulators containing silicon oxide.

The semiconductor memory device 1 further includes a plurality of columnar bodies 40. Each columnar body 40 penetrates the select gates SGS, the word lines WL, and the select gates SGD, and extends in the Z direction. The semiconductor memory device 1 further includes a plurality of bit lines BL provided above the select gates SGD.

The columnar bodies 40 are respectively and electrically connected to the bit lines BL through contact plugs 31. For example, one of the columnar bodies 40 sharing a select gate SGD0 and one of the columnar bodies 40 sharing a select gate SGD1 are electrically connected to one bit line BL.

An interlayer insulating film 83 is provided between the columnar body 40 and the bit lines BL. An interlayer insulating film 82 is provided between the interlayer insulating film 83 and the select gates SGD. The contact plugs 31 penetrate the interlayer insulating film 83. Each contact plug 31 includes a −Z side end connected to a semiconductor film of the columnar body 40 and a +Z side end connected to the bit line BL.

In the semiconductor memory device 1, the select gates SGD, the word lines WL, and the select gates SGS are each formed as a conductive layer. A stacked body SST in which the conductive layers and the insulating layers 7 are alternately stacked is formed on the +Z side of the source line SL. The stacked body SST is penetrated by the columnar bodies 40 to form a three-dimensional arrangement of memory cells (referred to as a memory cell array).

That is, in the semiconductor memory device 1, each portion where the word lines WL and the columnar bodies 40 intersect each other functions as the memory cell, and a memory cell array 2 in which a plurality of memory cells are three-dimensionally arranged is formed. In addition, each portion where the select gates SGS and the columnar bodies 40 intersect each other functions as a source side select gate, and each portion where the select gates SGD and the columnar bodies 40 intersect each other functions as a drain side select gate. In the semiconductor memory device 1, by increasing the number of stacked layers of the word line WL in the stacked body SST, the storage capacity can be increased without using a finer patterning technique.

Figure 2:
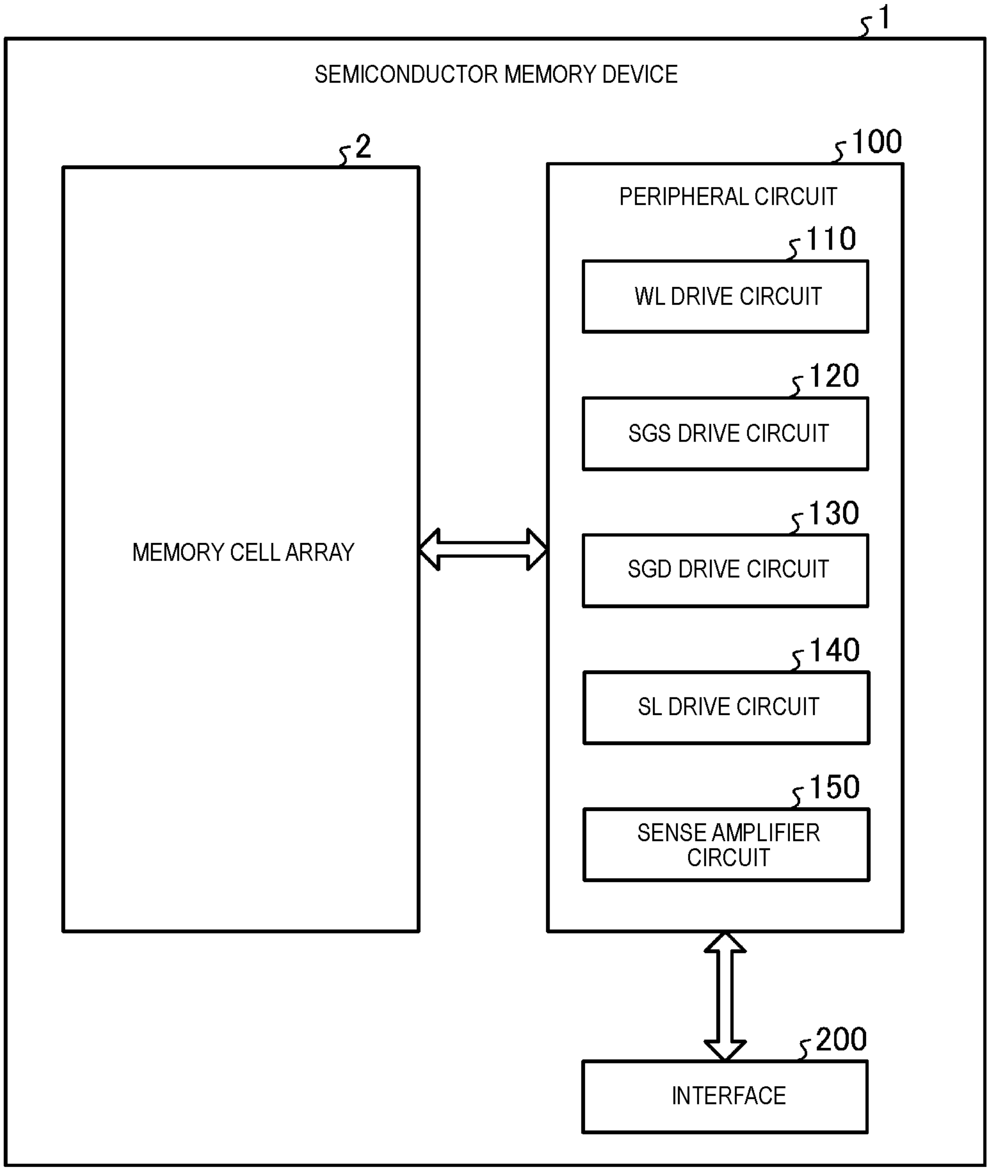
FIG. 2 is a block diagram showing a configuration of a semiconductor memory device according to the first embodiment.

FIG. 2 is a block diagram showing a schematic configuration of the semiconductor memory device 1.

As shown in FIG. 2, the semiconductor memory device 1 includes the memory cell array 2, a peripheral circuit 100, and an interface 200. The peripheral circuit 100 includes a WL drive circuit 110, an SGS drive circuit 120, an SGD drive circuit 130, an SL drive circuit 140, and a sense amplifier circuit 150.

The WL drive circuit 110 is a circuit that controls a voltage applied to the word lines WL, and the SGS drive circuit 120 is a circuit that controls a voltage applied to the select gates SGS. The SGD drive circuit 130 is a circuit that controls a voltage applied to the select gates SGD, and the SL drive circuit 140 is a circuit that controls a voltage applied to the source line SL. The sense amplifier circuit 150 is a circuit that controls a voltage applied to the bit line BL and is also a circuit that determines data stored in a selected memory cell according to a signal from the selected memory cell.

The peripheral circuit 100 controls the operation of the semiconductor memory device 1 based on an instruction input from the outside (for example, a memory controller of a memory system to which the semiconductor memory device 1 is applied) through the interface 200.

Figure 3:
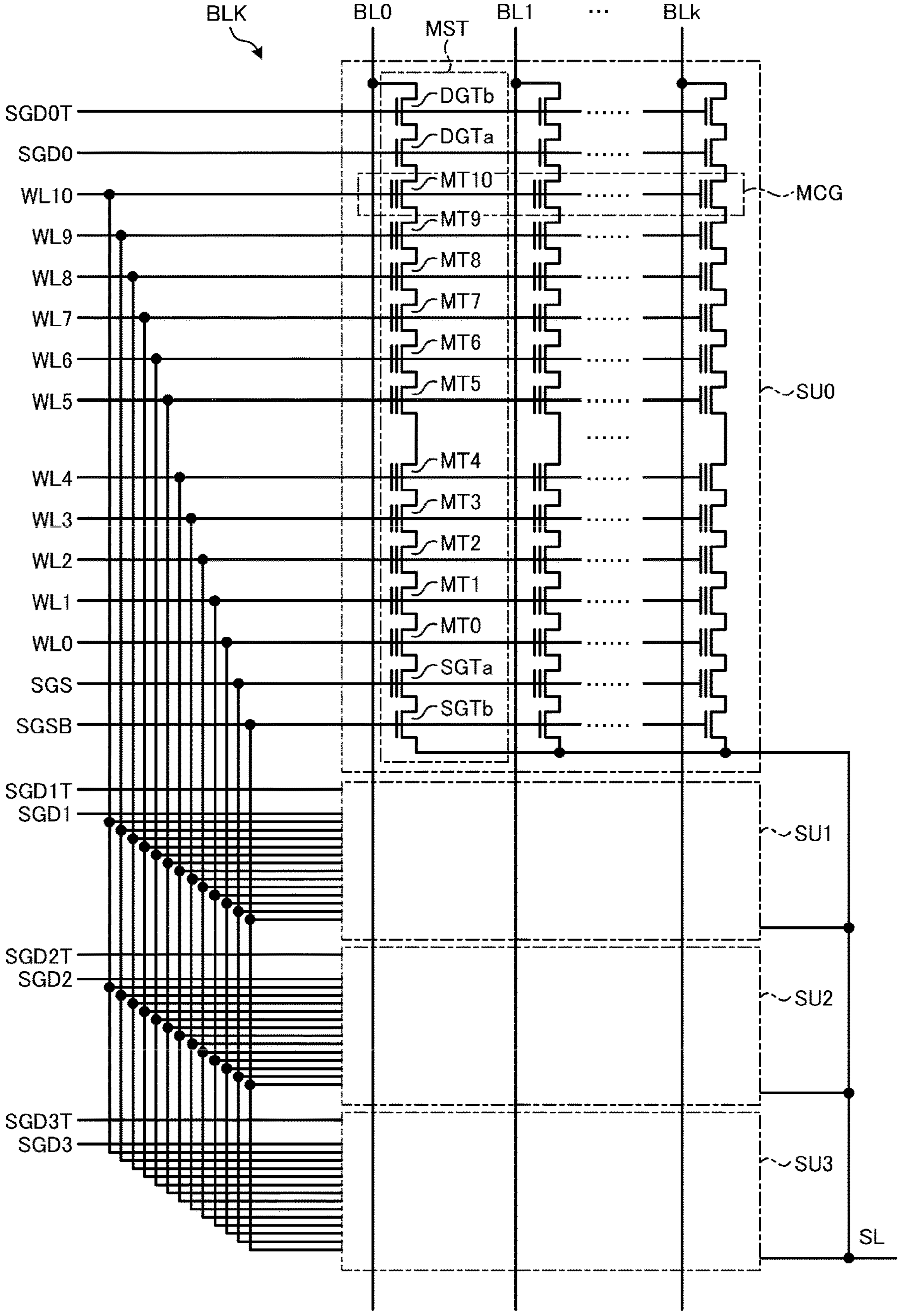
FIG. 3 is a circuit diagram showing a configuration of a memory cell array in the first embodiment.

Next, the circuit configuration of the memory cell array 2 will be described with reference to FIG. 3. FIG. 3 is a circuit diagram showing a configuration of the memory cell array 2.

The memory cell array 2 includes a plurality of blocks BLK, each of which is a set of a plurality of memory cell transistors MT. Hereinafter, the memory cell transistor MT will be simply referred to as a memory cell MT.

Each block BLK includes a plurality of string units SU0, SU1, SU2, and SU3, which are sets of memory cells MT associated with the word lines WL and the bit lines BL. Each of the string units SU0 to SU3 includes a plurality of memory strings MST in which the memory cells MT are connected in series. The number of memory strings MST in the string units SU0 to SU3 may be freely selected.

The plurality of string units SU0, SU1, SU2, and SU3 correspond to a plurality of select gates SGD0, SGD1, SGD2, and SGD3 and share the select gate SGS, and function as a plurality of drive units in the block BLK. Each string unit SU may be driven by the corresponding select gate SGD and the select gate SGS. In addition, each string unit SU includes a plurality of memory strings MST.

Each memory string MST includes, for example, ten memory cells MT (MT0 to MT9) and select transistors DGT and SGT. The memory cell MT includes a control gate and a charge storage film, and stores data in a non-volatile manner. The ten memory cells MT are connected in series between the source of the select transistor DGT and the drain of the select transistor SGT. The number of memory cells MT in the memory string MST is not limited to ten.

The gate of a select transistor DGTb in each of the string units SU0 to SU3 is connected to each of select gates SGD0T to SGD3T. The gate of a select transistor DGTa in each of the string units SU0 to SU3 is connected to each of select gates SGD0 to SGD3. On the other hand, the gate of a select transistor SGTa in each string unit SU is connected in common to, for example, the select gate SGS. The gate of a select transistor SGTb in each string unit SU is connected in common to, for example, the select gate SGSB.

The drains of the select transistors DGT of the memory strings MST in each string unit SU are connected to different bit lines BL0 to BLk (k is any integer equal to or more than 2). In addition, the bit lines BL0 to BLk is connected in common to one memory string MST in each string unit SU across the plurality of blocks BLK. Further, the source of each select transistor SGT is connected in common to the source line SL.

That is, the string unit SU is a set of the memory strings MST that are connected to different bit lines BL0 to BLk and connected to the identical select gate SGD. Further, each block BLK is a set of the plurality of string units SU0 to SU3 sharing the common word lines WL. The memory cell array 2 is a set of the plurality of blocks BLK sharing the common bit lines BL0 to BLk.

When a group of the memory cells MT sharing one word line WL is referred to as a "memory cell group MCG", the memory cell group MCG is a minimum unit of a set of memory cells MT to which a predetermined voltage (for example, a write voltage or a read voltage) can be collectively applied through the word lines WL.

Figure 4:
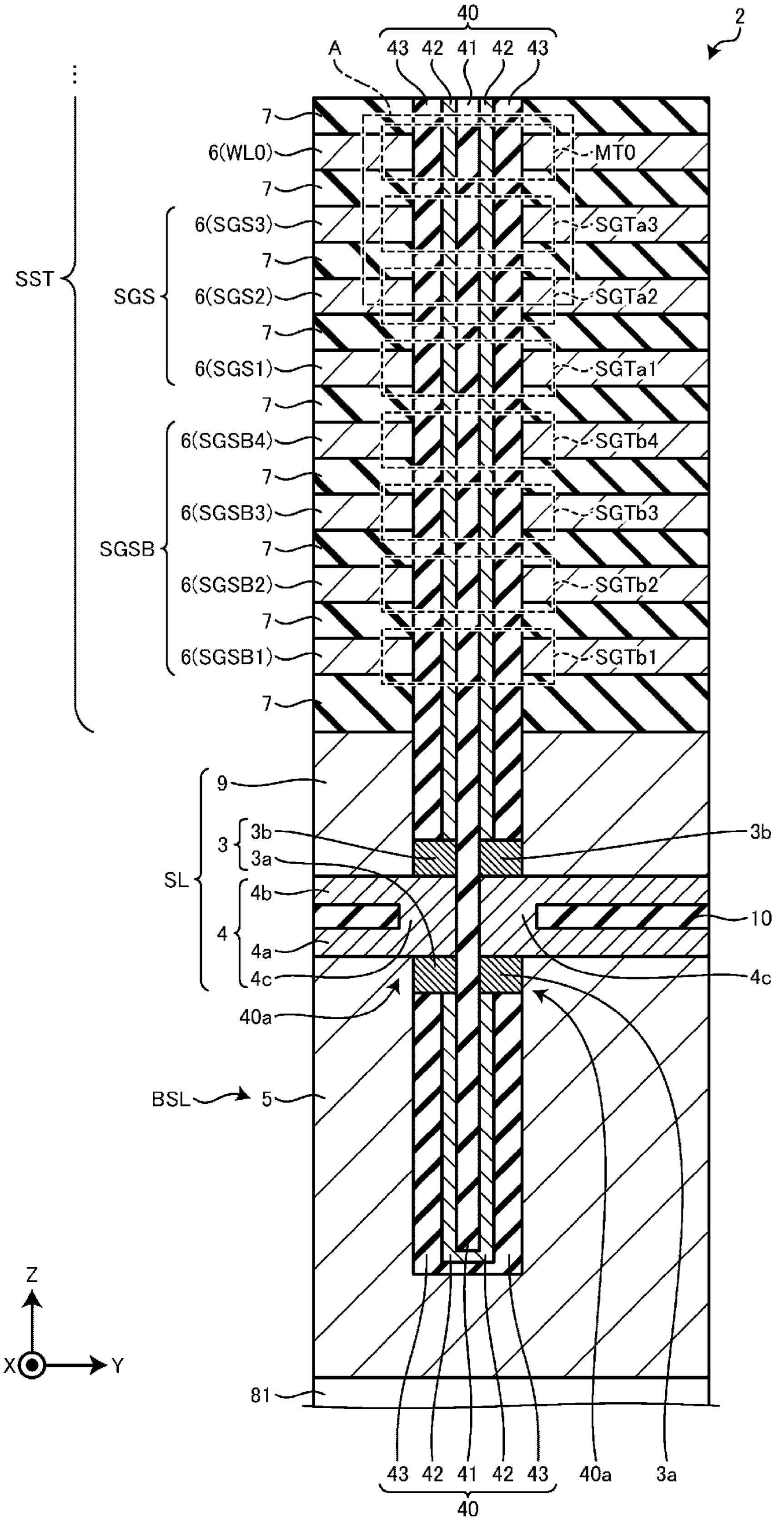
FIG. 4 is a cross-sectional view showing a configuration of the memory cell array in the first embodiment.

Next, a cross-sectional configuration of the memory cell array 2 will be described with reference to FIG. 4. FIG. 4 is a cross-sectional view showing a configuration of the memory cell array 2.

In the semiconductor memory device 1, a conductive film 4 is disposed on the +Z side of the substrate SUB above the interlayer insulating film 81. A conductive film 3 is disposed between the conductive film 4 and the semiconductor film of the columnar body 40. The conductive film 4 extends in a plate shape in the X direction and the Y direction (hereinafter referred to as the "XY direction") and functions as a part of the source line SL (see FIG. 1). The conductive film 3 extends in an annular shape in the XY direction in the vicinity of a central axis CA of the columnar body 40, is sandwiched between the conductive film 4 and the semiconductor film of the columnar body 40, and functions as another part of the source line SL. The plurality of columnar bodies 40 are each disposed on the +Z side of a respective conductive film 3. The plurality of columnar bodies 40 are arranged in the XY direction. Each columnar body 40 extends in the Z direction and penetrates the stacked body SST (see FIG. 1).

Each columnar body 40 has a columnar shape having the central axis CA along the Z direction and has, for example, a substantially circular columnar shape. In FIG. 4, a portion of the columnar body 40 in the vicinity of the −Z side end is illustrated. Each columnar body 40 may have a tapered shape in which the diameter of the −Z side end is smaller than the diameter of the +Z side end. Each columnar body 40 may have a bowing shape in which the diameter of the −Z side end is smaller than the diameter of the +Z side end and the diameter is widened at a predetermined Z position between the +Z side end and the −Z side end. The diameter of the −Z side end of the columnar body 40 is smaller than the diameter of the +Z side end of the columnar body 40.

Figure 5A:
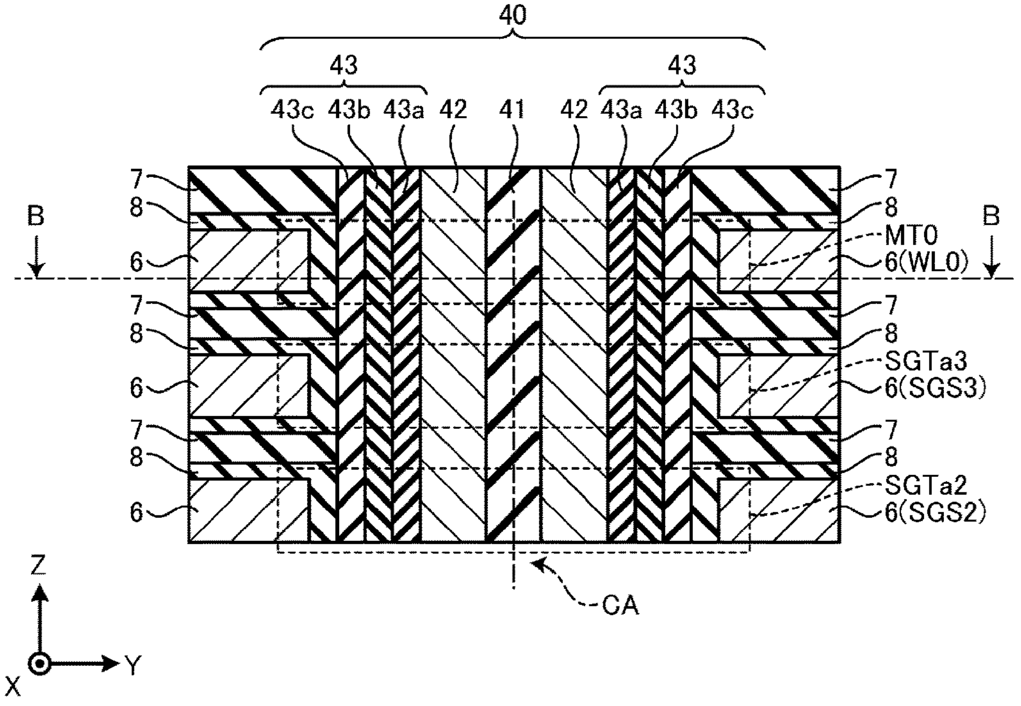
FIGS. 5A and 5B are sectional views showing a configuration of a memory cell in the first embodiment.
Figure 5B:
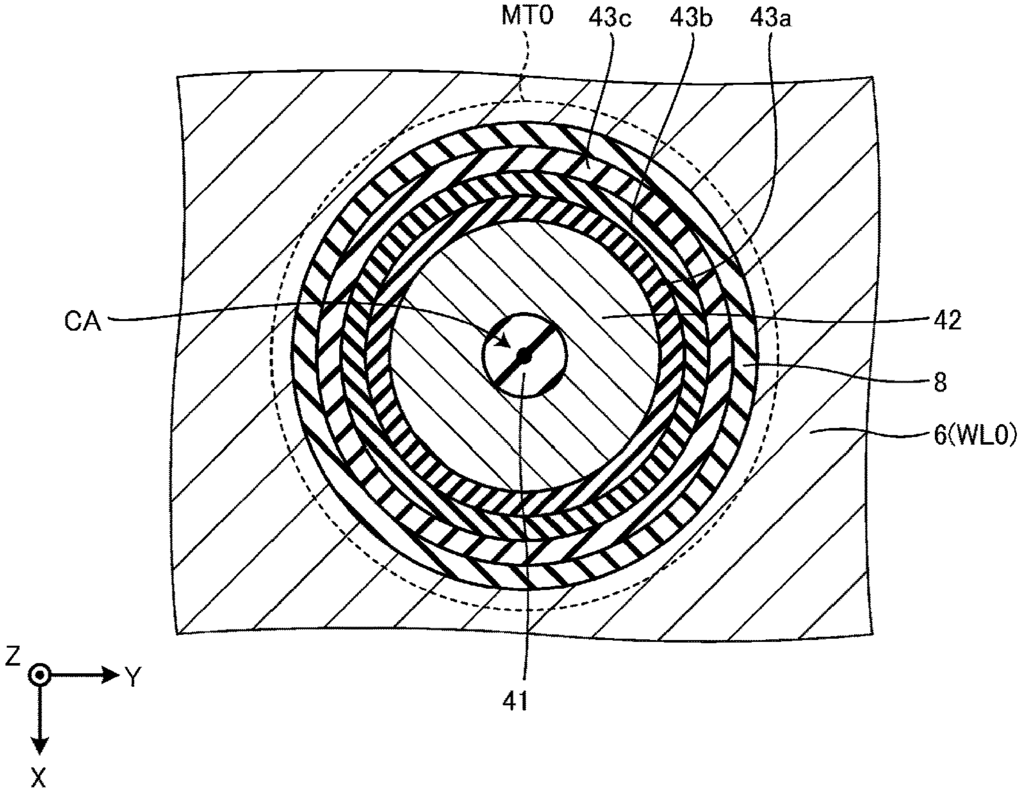

As shown in FIGS. 5A and 5B, the columnar body 40 includes a core member 41, a semiconductor film 42, and an insulating film 43 in order from a central axis CA side. The insulating film 43 is a multilayer film including an insulating film 43*a*, a charge storage film 43*b*, and an insulating film 43*c* in order from the central axis CA side. FIG. 5A is a YZ sectional view showing the configuration of the memory cell and is an enlarged sectional view obtained by enlarging a portion A of FIG. 4. FIG. 5B is an XY sectional view showing the configuration of the memory cell and shows a cross-section taken along a line B-B of FIG. 5A.

The core member 41 is disposed in the vicinity of the central axis CA of the columnar body 40 and has a substantially circular columnar shape extending along the central axis CA of the columnar body 40. The core member 41 may be formed of a material containing an insulating substance (for example, a semiconductor oxide such as silicon oxide) as a main component.

The semiconductor film 42 has a substantially cylindrical shape extending along the central axis CA of the columnar body 40 to surround the core member 41 from the outside. The semiconductor film 42 further covers the −Z side end portion of the core member 41 and is connected to the conductive film 3. The semiconductor film 42 may be formed of a material containing, as a main component, a semiconductor (for example, polysilicon) containing substantially no impurity.

The insulating film 43*a* has a substantially cylindrical shape extending along the central axis CA of the columnar body 40 to surround the semiconductor film 42 from the outside. The insulating film 43*a* may be formed of a material containing an oxide (for example, a silicon oxide or a silicon oxynitride) as a main component.

The charge storage film 43*b* has a substantially cylindrical shape extending along the central axis CA of the columnar body 40 to surround the insulating film 43*a* from the outside. The charge storage film 43*b* may be formed of a material containing a nitride (for example, a silicon nitride) as a main component.

The insulating film 43*c* has a substantially cylindrical shape extending along the central axis CA of the columnar body 40 to surround the charge storage film 43*b* from the outside. The insulating film 43*c* may be formed of a material containing an oxide (for example, a silicon oxide, a metal oxide, or a stack thereof) as a main component. Consequently, an ONO type three-layer structure in which the charge storage film 43*b* is sandwiched between a pair of the insulating films 43*a* and 43*c* may be formed.

An insulating film 8 extends to cover the insulating film 43*c* from the outside in the XY direction and cover a +Z side surface of a conductive layer 6, a surface of the conductive layer 6 on the columnar body 40 side, and a −Z side surface of the conductive layer 6, and forms a substantially hollow disc shape having an axis along the Z direction. The insulating film 8 may be formed of an insulating substance such as an aluminum oxide. Hereinafter, for the sake of simplicity, the illustration and description of the insulating film 8 may be omitted.

The semiconductor film 42 of the columnar body 40 is connected to the conductive film 3 serving as the source line SL on the −Z side and is connected to the conductive layer functioning as the bit line BL through the contact plug 31 on the +Z side. That is, the semiconductor film 42 of the columnar body 40 includes a channel region (active region) in the memory string MST.

In each stacked body SST, as shown in FIG. 4, the conductive layer 6 and the insulating layer 7 are alternately and repeatedly stacked. Each conductive layer 6 extends in a plate shape in the XY direction. Each conductive layer 6 may be formed of a material containing a conductive substance (for example, a metal such as tungsten) as a main component. Each conductive layer 6 may include the +Z side surface, the −Z side surface, and the surface facing the columnar body 40 covered with the insulating film 8. The insulating film 8 may have a composition different from that of the insulating film 43*c*. The insulating film 8 may be formed of a material containing an insulating substance (for example, a metal oxide such as an aluminum oxide, a zirconium oxide, or a hafnium oxide) as a main component. Each insulating layer 7 extends in a plate shape in the XY direction. Each insulating layer 7 may be formed of a material containing an insulating substance (for example, a semiconductor oxide such as a silicon oxide) as a main component.

In the stacked body SST, among the plurality of conductive layers 6 spaced apart from each other in the Z direction, the conductive layers 6 on the −Z side function as the select gates SGSB and SGS (see FIG. 1), the conductive layers 6 on the +Z side function as the select gates SGDT and SGD (see FIG. 1), and the conductive layers 6 between the conductive layers 6 on the −Z side and the +Z side function as the word lines WL. In FIG. 4, a configuration is illustrated in which the conductive layer 6 of a select gate SGSB1, the conductive layer 6 of a select gate SGSB2, the conductive layer 6 of a select gate SGSB3, the conductive layer 6 of a select gate SGSB4, the conductive layer 6 of a select gate SGS1, the conductive layer 6 of a select gate SGS2, and the conductive layer 6 of a select gate SGS3 are stacked in the stacked body SST from the −Z side.

A select transistor SGTb1 is formed at a position where the conductive layer 6 of the select gate SGSB1 intersects the semiconductor film 42. A select transistor SGTb2 is formed at a position where the conductive layer 6 of the select gate SGSB2 intersects the semiconductor film 42. A select transistor SGTb3 is formed at a position where the conductive layer 6 of the select gate SGSB3 intersects the semiconductor film 42. A select transistor SGTb4 is formed at a position where the conductive layer 6 of the select gate SGSB4 intersects the semiconductor film 42.

A select transistor SGTa1 is formed at a position where the conductive layer 6 of the select gate SGS1 intersects the semiconductor film 42 and the charge storage film 43*b*. A select transistor SGTa2 is formed at a position where the conductive layer 6 of the select gate SGS2 intersects the semiconductor film 42. A select transistor SGTa3 is formed at a position where the conductive layer 6 of the select gate SGS3 intersects the semiconductor film 42 and the charge storage film 43*b*.

The memory cell MT0 is formed at a position where the conductive layer 6 of a word line WL0 intersects the semiconductor film 42 and the charge storage film 43*b*. The memory cell MTI is formed at a position where the conductive layer 6 of a word line WL1 intersects the semiconductor film 42 and the charge storage film 43*b*. The memory cell MT10 is formed at a position where the conductive layer 6 of a word line WL10 intersects the semiconductor film 42 and the charge storage film 43*b*.

A select transistor SGTa is formed at a position where the conductive layer 6 of the select gate SGD intersects the semiconductor film 42.

The select transistor SGTb is formed at a position where the conductive layer 6 of the select gate SGDT intersects the semiconductor film 42.

The columnar body 40 may not include the charge storage film 43*b* and the insulating film 43*c* at the positions where the conductive layers 6 of the select gates SGD and SGDT intersect the columnar body 40.

As shown in FIG. 4, the memory cell array 2 has a direct strap contact (DSC) structure on the −Z side of the stacked body SST. In the DSC structure, the source line SL is in contact with the semiconductor film 42. In the DSC structure, the interlayer insulating film 81, a semiconductor film 5, the conductive film 4, and a semiconductor film 9 are stacked sequentially on the substrate SUB between the substrate SUB (see FIG. 1) and the stacked body SST, and the conductive film 3 is disposed between the semiconductor film 42 and the conductive film 4. The conductive film 4, the conductive film 3, and the semiconductor film 9 function as the source line SL, and the semiconductor film 5 functions as the source line BSL. In the columnar body 40, the insulating film 43, and the semiconductor film 42 penetrate the stacked body SST in the Z direction while covering the side surface of the core member 41, and an opening 40*a* is disposed at the Z position corresponding to the conductive films 3 and 4. The conductive films 3 and 4 are disposed in the opening 40*a* to be electrically connected to the semiconductor film 42.

The semiconductor film 5 extends in the XY direction. The tip of the columnar body 40 on the −Z side reaches the semiconductor film 5. The semiconductor film 5 is formed of a material containing a polycrystalline semiconductor (for example, polysilicon) as a main component and contains an N-type impurity (for example, phosphorus or arsenic) at a first concentration. The semiconductor film 5 functions as the source line BSL.

The conductive film 4 is disposed between the semiconductor film 5 and the semiconductor film 9 in the Z direction, and the conductive film 4 extends in the XY direction. The conductive film 4 is penetrated by the columnar body 40 in the Z direction.

The conductive film 4 includes a conductive film 4*a*, a conductive film 4*b*, and a conductive film 4*c*. The conductive film 4*c* covers the side surface of the core member 41. At the XY position corresponding to the columnar body 40, a +Z side main surface of the conductive film 4*c* is in contact with the conductive film 3 and a −Z side main surface thereof is in contact with the conductive film 3. The conductive film 4*a* extends in the XY direction from the outer peripheral surface of the +Z side portion of the conductive film 4*c*. The conductive film 4*b* extends in the XY direction from the outer peripheral surface of the −Z side portion of the conductive film 4*c*. A core insulating film 10 is disposed between the conductive film 4*a* and the conductive film 4*b* in the Z direction. The core insulating film 10 extends in the XY direction from the outer peripheral surface of the middle portion in the Z direction of the conductive film 4*c*.

Each of the conductive film 4*a*, the conductive film 4*b*, and the conductive film 4*c* is formed of a material containing a polycrystalline semiconductor (for example, polysilicon) as a main component and contains an N-type impurity (for example, phosphorus or arsenic) at a second concentration. The core insulating film 10 is formed of a material containing an insulating substance (for example, a semiconductor oxide such as a silicon oxide) as a main component.

The semiconductor film 9 is formed of a material containing a polycrystalline semiconductor (for example, polysilicon) as a main component and contains an N-type impurity (for example, phosphorus or arsenic) at a third concentration. The semiconductor film 9 functions as the source line SL.

The conductive film 3 is disposed between the conductive film 4 and the semiconductor film 42 in the Z direction. The conductive film 3 is sandwiched between one end of the semiconductor film 42 and the +Z side main surface of the conductive film 4. The conductive film 3 is in contact with the conductive film 4 and is in contact with one end of the semiconductor film 42.

The conductive film 3 includes a conductive film 3*a* and a conductive film 3*b*. A −Z side main surface of the conductive film 3*b* is in contact with the conductive film 4, and a +Z side main surface thereof is in contact with one end of the semiconductor film 42 on the −Z side. A +Z side main surface of the conductive film 3*a* is in contact with the conductive film 4, and a −Z side main surface thereof is in contact with one end of the semiconductor film 42 on the +Z side.

Each of the conductive film 3*a* and the conductive film 3*b* is formed of a material containing a polycrystalline semiconductor (for example, polysilicon) as a main component and contains an N-type impurity (for example, phosphorus or arsenic) at a fourth concentration.

The conductive film 3*a* and the conductive film 3*b* further contain carbon at a fifth concentration, which is, for example, about $1\times10^{19}$ $cm^{-3}$ or more. Accordingly, the average grain size of the polycrystalline semiconductor in the conductive film 3*a* and the conductive film 3*b* is smaller than the average grain size of the polycrystalline semiconductor in the conductive film 4*a*, the conductive film 4*b*, and the conductive film 4*c*.

A method for determining the average grain size is not particularly limited, and for example, an average grain size measured using a flow-type particle image analysis device, a particle size distribution measuring device using a laser diffraction and scattering method, or the like may be used. Alternatively, the average grain size may be calculated from a transmission electron microscope (TEM) image by using the Intercept method (also referred to as the Heyn method) or the Planimetric method (also referred to as the Jeffries method).

In a write operation performed on the memory cell MT, a write voltage is applied to the conductive layer 6 of the selected word line WL, a transfer voltage is applied to the conductive layer 6 of the non-selected word line WL, a reference voltage is applied to the semiconductor film 42, a select voltage is applied to the select gates SGD and SGDT of the selected string, and a reference voltage is applied to the select gates SGS and SGSB. The write voltage has a voltage (for example, 20 V) for injecting charge (electrons) from the semiconductor film 42 into the charge storage film 43*b*. The transfer voltage has a voltage (for example, 10 V) between the write voltage and the reference voltage. The reference voltage has a voltage as a reference (for example, 0 V). The select voltage has a voltage (for example, 2.5 V) at which the select transistors DGTa and DGTb are turned on, and the reference voltage has a voltage at which the select transistors SGTa and SGTb are turned off. As a result, charge is stored in the charge storage film 43*b* of the select memory cell MT at a position where the conductive layer 6 of the selected word line WL intersects the semiconductor film 42, and data is written into the select memory cell MT.

In an erasing operation of the information with respect to the memory cell MT, a reference voltage is applied to the conductive layer 6 of each word line WL, an erase voltage is applied to the semiconductor film 42, a select voltage is applied to the select gates SGD and SGDT, and an intermediate voltage between the erase voltage and the reference voltage is applied to the select gates SGS and SGSB. The erase voltage has a voltage (for example, 20 V) for injecting opposite charge (holes) from the semiconductor film 42 into the charge storage film 43*b*. The reference voltage has a voltage as a reference (for example, 0 V). The select voltage has a voltage (for example, 20 V) at which the select transistors DGTa and DGTb are turned off, and the intermediate voltage has a voltage (for example, 5 V) between the erase voltage and the reference voltage. Through such control, gate-induced drain leakage (GIDL) in the vicinity of the drain of the select transistor SGTb generates an electron-hole pair, and opposite charge (holes) is injected into the charge storage film 43*b* from the semiconductor film 42. As a result, the charge stored in the charge storage film 43*b* is erased, and the any data written into the memory cell MT can be erased.

In the erasing operation, the select transistor SGTb corresponding to the select gate SGSB has a function of generating GIDL, and the select transistor SGTa corresponding to the select gate SGS has a function of electrically connecting and disconnecting the semiconductor film 42 and the source line SL (conductive films 3 and 4).

During manufacturing of the semiconductor memory device 1, the N-type impurities contained in the semiconductor films 5 and 9 and the conductive film 4 diffuse into the semiconductor film 42 through the conductive film 3. Accordingly, the concentration of the N-type impurity in the semiconductor film 42 is relatively high in a portion in contact with the conductive film 3 as indicated by a solid line in FIG. 6A, but tends to decrease as it approaches the Z position of the channel region of the select gate SGSB.

Figure 6A:
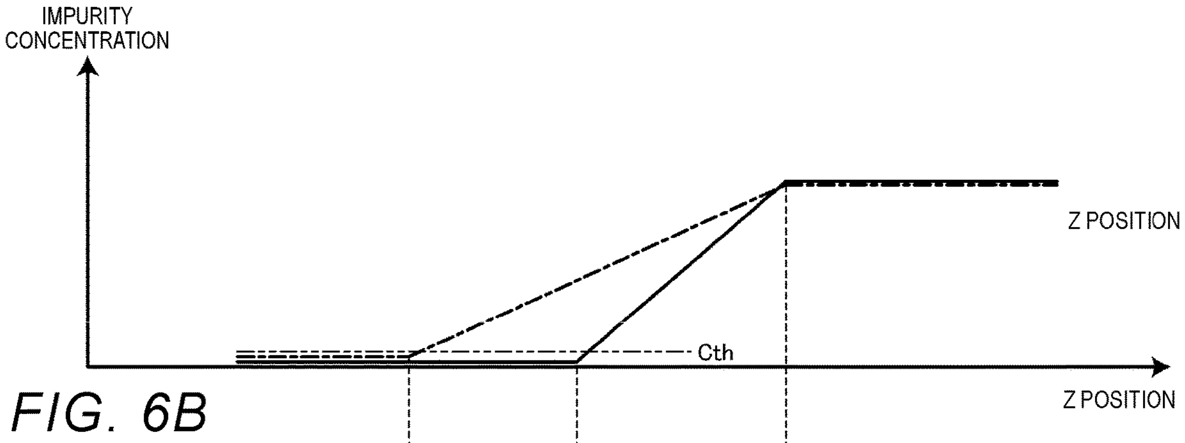
FIGS. 6A and 6B are diagrams showing a distribution of an impurity concentration of a semiconductor film in the first embodiment.
Figure 6B:
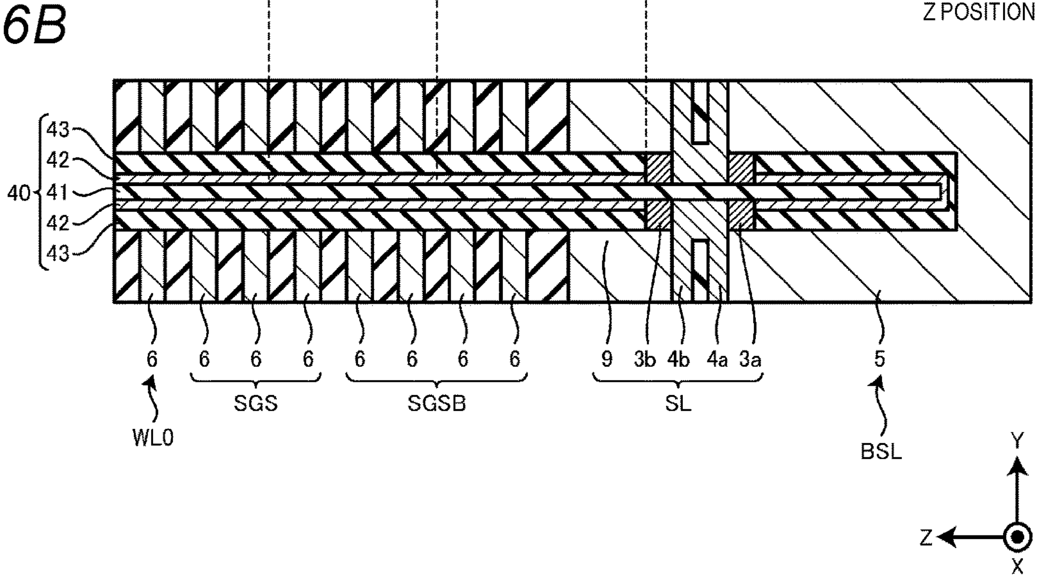

FIGS. 6A and 6B are diagrams showing the distribution of the impurity concentration of the semiconductor film 42. FIG. 6A shows a distribution of the concentration of the N-type impurity of the semiconductor film 42 in the Z direction, a vertical axis represents the concentration of the N-type impurity, and a horizontal axis represents the Z position. FIG. 6B shows a YZ cross-section of the semiconductor film 42 corresponding to the horizontal axis (Z position) of FIG. 6A.

At this time, as described above, the average grain size of the polycrystalline semiconductor in the conductive film 3*a* and the conductive film 3*b* is smaller than the average grain size of the polycrystalline semiconductor in the conductive film 4*a*, the conductive film 4*b*, and the conductive film 4*c* according to the inclusion of carbon at the fifth concentration in the conductive film 3*a* and the conductive film 3*b*. As a result, the amount of N-type impurities diffused from the semiconductor films 5 and 9 and the conductive film 4 to the semiconductor film 42 through the conductive film 3*a* and the conductive film 3*b* can be properly controlled.

That is, as indicated by the solid line in FIG. 6A, in the semiconductor film 42, the N-type impurity is contained in the channel region of the select gate SGSB at a concentration equal to or higher than a threshold concentration Cth, but the N-type impurity is reduced to a concentration less than the threshold concentration Cth in the channel region of the select gate SGS. As a result, it is possible to improve the efficiency of GIDL generation at the select gate SGSB during the erasing operation and to properly turn on and off the select gate SGS.

A method for determining the impurity concentration is not particularly limited, and for example, a concentration measured using a secondary ion mass spectrometry (SIMS) device or the like may be used.

Next, a method of manufacturing the semiconductor memory device 1 will be described with reference to FIGS. 7 to 16 and FIG. 4. FIGS. 7 to 16 are YZ sectional views showing the method of manufacturing the semiconductor memory device 1. FIG. 4 is a YZ sectional view showing the structure of the semiconductor memory device 1 and is also used as a cross-sectional view showing the manufacturing method.

Figure 7:
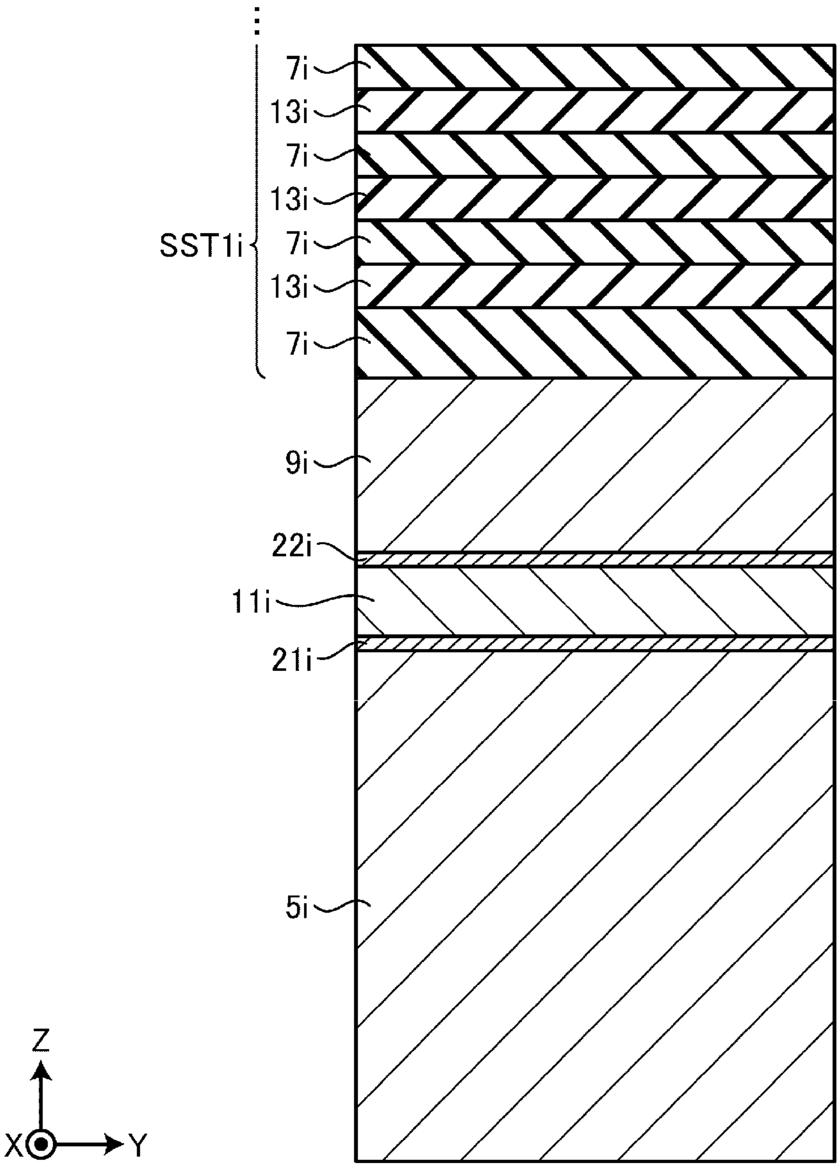
FIGS. 7-16 are cross-sectional views showing a method of manufacturing the semiconductor memory device according to the first embodiment.

In the process shown in FIG. 7, a transistor is formed on a substrate SUB (see FIG. 1), and a contact plug, a wiring film, a via plug, and the like are formed on the substrate SUB. Also, the interlayer insulating film 81 is formed around the contact plug, the wiring film, the via plug, and the like. Consequently, the peripheral circuit 100 is formed. The interlayer insulating film 81 may be formed by depositing a material containing an insulating substance (for example, a semiconductor oxide such as a silicon oxide) as a main component on the +Z side of the substrate SUB.

A semiconductor layer 5*i* is deposited on the +Z side of the interlayer insulating film 81. The semiconductor layer 5*i* may be formed of a material containing a semiconductor (for example, silicon) containing an N-type impurity (for example, phosphorus or arsenic) as a main component.

An insulating layer 21*i* is deposited on the +Z side of the semiconductor layer 5*i*. The insulating layer 21*i* may be formed of a material containing an oxide (for example, a silicon oxide) as a main component.

A sacrificial layer 11*i* is deposited on the +Z side of the insulating layer 21*i*. The sacrificial layer 11*i* may be formed of a material containing a material (for example, a silicon nitride), which can ensure the etching selectivity with the semiconductor layer 5$i$, as a main component.

An insulating layer 22$i$ is deposited on the +Z side of the sacrificial layer 11$i$. The insulating layer 22$i$ may be formed of a material containing an oxide (for example, a silicon oxide) as a main component.

A semiconductor layer 9$i$ is deposited on the +Z side of the insulating layer 22$i$. The semiconductor layer 9$i$ may be formed of a material containing a semiconductor (for example, silicon) containing an N-type impurity (for example, phosphorus or arsenic) as a main component.

An insulating layer 7$i$ and a sacrificial layer 13$i$ are alternately deposited a plurality of times on the +Z side of the semiconductor layer 9$i$ to form a stacked body SST1$i$. The insulating layer 7$i$ may be formed of a material containing an oxide (for example, a silicon oxide) as a main component. The sacrificial layer 13$i$ may be formed of a material containing a nitride (for example, a silicon nitride) as a main component. Each insulating layer 7$i$ and each sacrificial layer 13$i$ may be deposited with approximately the same film thickness.

Figure 8:
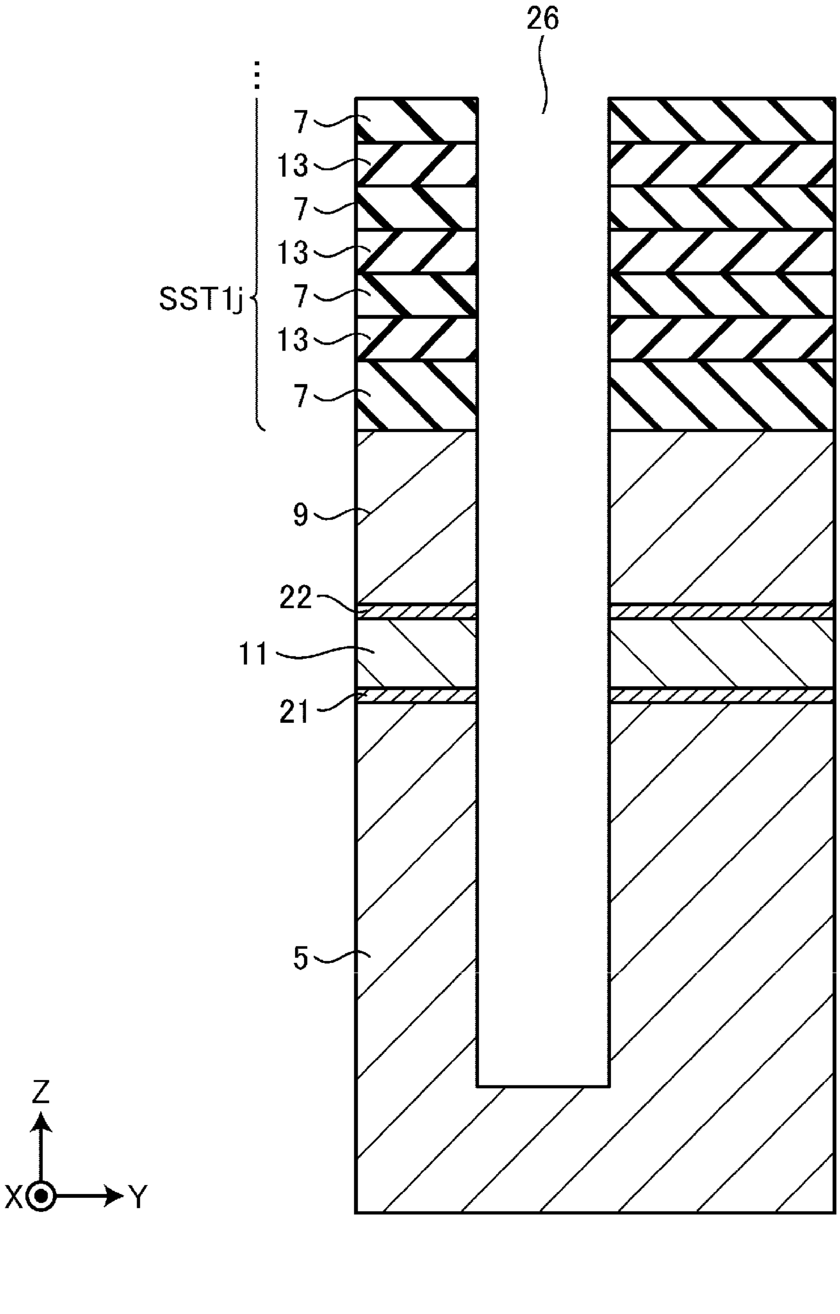

In the process shown in FIG. 8, a patterned resist in which a formation position for a memory hole 26 is formed on the stacked body. Anisotropic etching such as a reactive ion etching (RIE) method is performed using the patterned resist as a mask to form the memory hole 26 that penetrates a stacked body SST1$j$, the semiconductor film 9, an insulating layer 22, a sacrificial layer 11, and an insulating layer 21 and reaches the semiconductor film 5.

Figure 9:
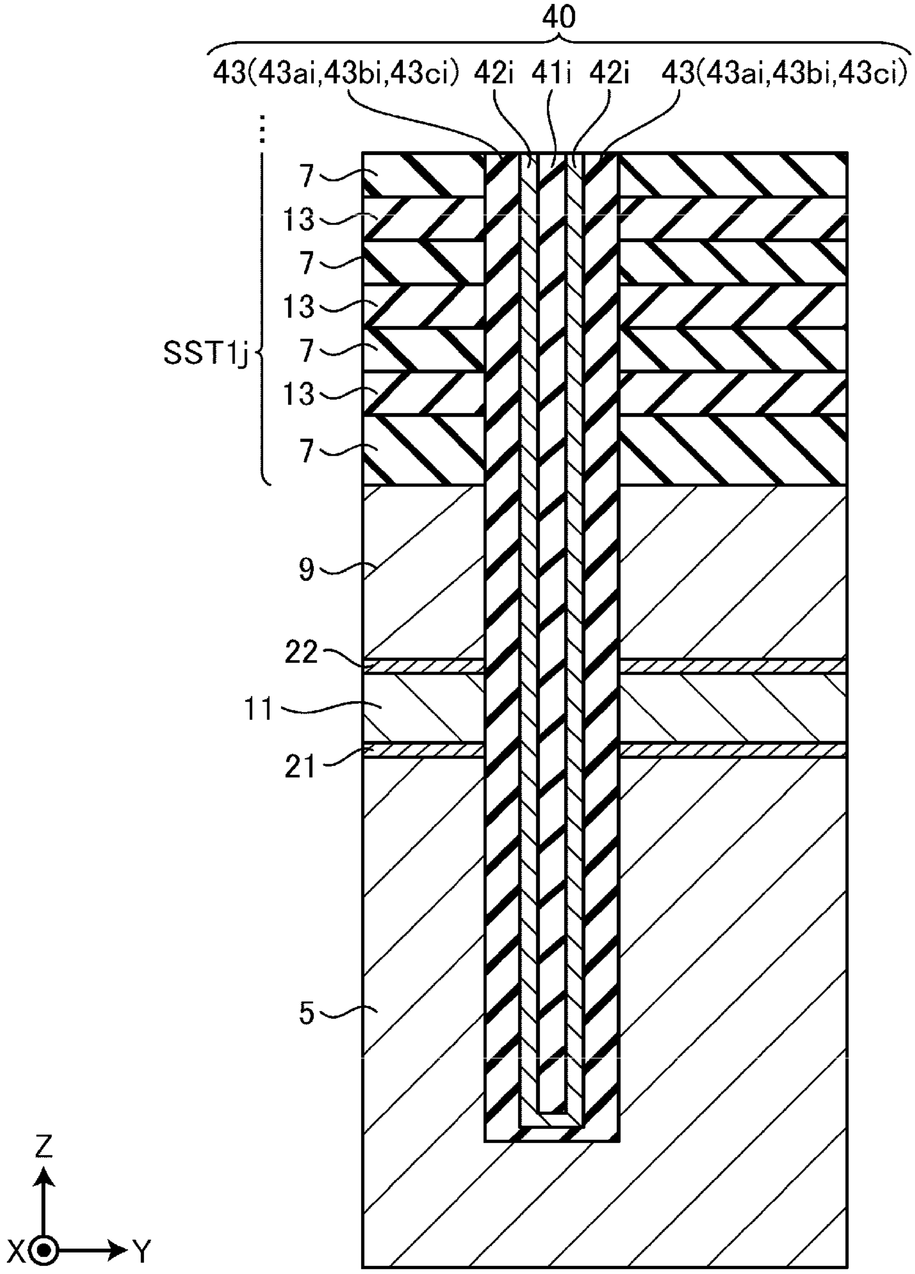

In the process shown in FIG. 9, an insulating film 43$ci$, a charge storage film 43$bi$, and an insulating film 43$ai$ (see FIGS. 5A and 5B) are sequentially deposited on a side surface and a bottom surface of the memory hole 26. The insulating film 43$ci$ may be formed of a material containing an oxide (for example, a silicon oxide, a metal oxide, or a stack thereof) as a main component. The charge storage film 43$bi$ may be formed of a material containing a nitride (for example, a silicon nitride) as a main component. The insulating film 43$ai$ may be formed of a material containing an oxide (for example, a silicon oxide or a silicon oxynitride) as a main component. In FIG. 9, for the sake of simplicity, a multilayer film in which the insulating film 43$ci$, the charge storage film 43$bi$, and the insulating film 43$ai$ are stacked is shown as an insulating film 43. A semiconductor film 42$i$ is deposited on the side surface and the bottom surface of the memory hole 26. The semiconductor film 42$i$ may be formed of a material containing, as a main component, a semiconductor (for example, polysilicon) containing substantially no impurity. Then, a core member 41 is embedded into the memory hole 26. The core member 41 may be formed of a material containing an insulating substance (for example, a semiconductor oxide such as a silicon oxide) as a main component. As a result, the columnar body 40 penetrating the stacked body SST1$i$, the semiconductor film 9, the sacrificial layer 11, and the semiconductor film 5 in the Z direction is formed.

Figure 10:
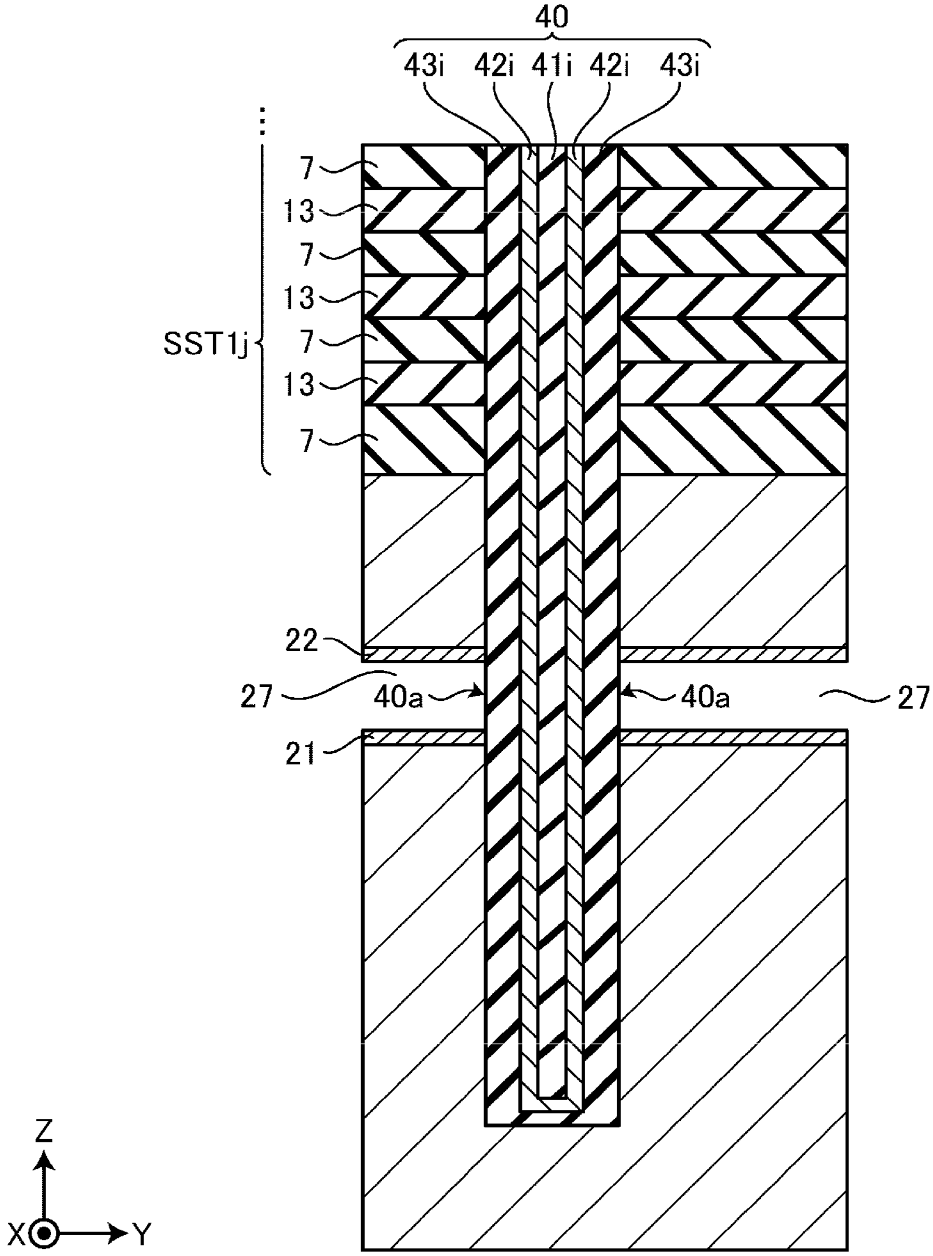

In the process shown in FIG. 10, the sacrificial layer 11 is removed by isotropic etching such as wet etching, and a void 27 is formed. The void 27 exposes a part of an outer side surface 40$a$ of the columnar body 40.

Figure 11:
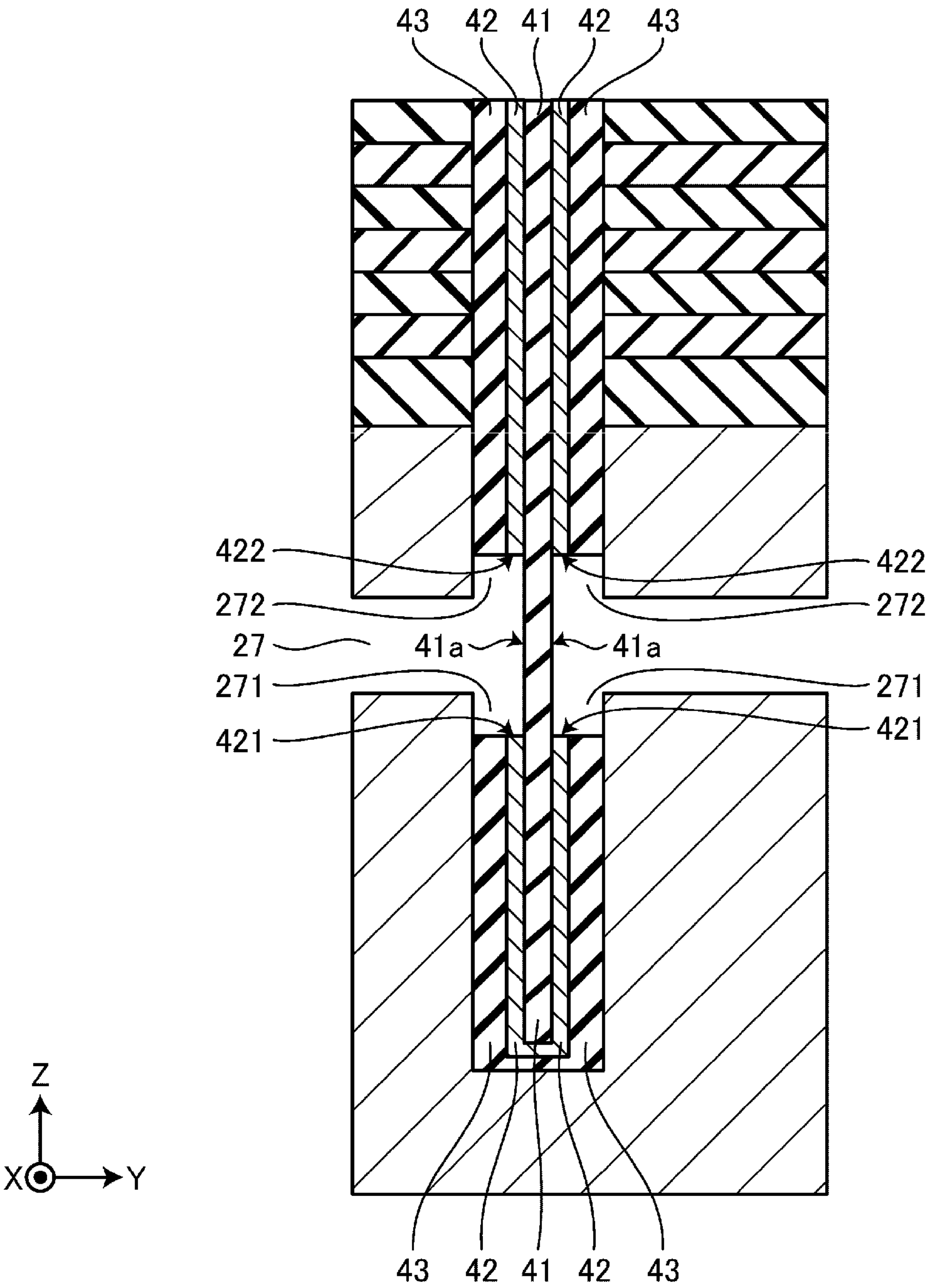

In the process shown in FIG. 11, the insulating layers 21 and 22 are removed by isotropic etching such as wet etching, and a portion of the insulating film 43 and the semiconductor film 42 in the vicinity of the exposed surface is removed. Consequently, a part of an outer side surface 41$a$ of the core member 41, a +Z side end 421 of the semiconductor film 42 on the −Z side, and a −Z side end 422 of the semiconductor film 42 on the +Z side are exposed, and grooves 271 and 272 along the outer side surface 41$a$ are formed. The groove 271 extends in the −Z direction along the outer side surface 41$a$ of the core member 41 from the void 27. The groove 271 has a substantially cylindrical shape. The groove 272 extends in the +Z direction along the outer side surface 41$a$ of the core member 41 from the void 27. The groove 272 has a substantially cylindrical shape. The groove 271, the groove 272, and the void 27 surround the core member 41 in the XY plane view.

Figure 12:
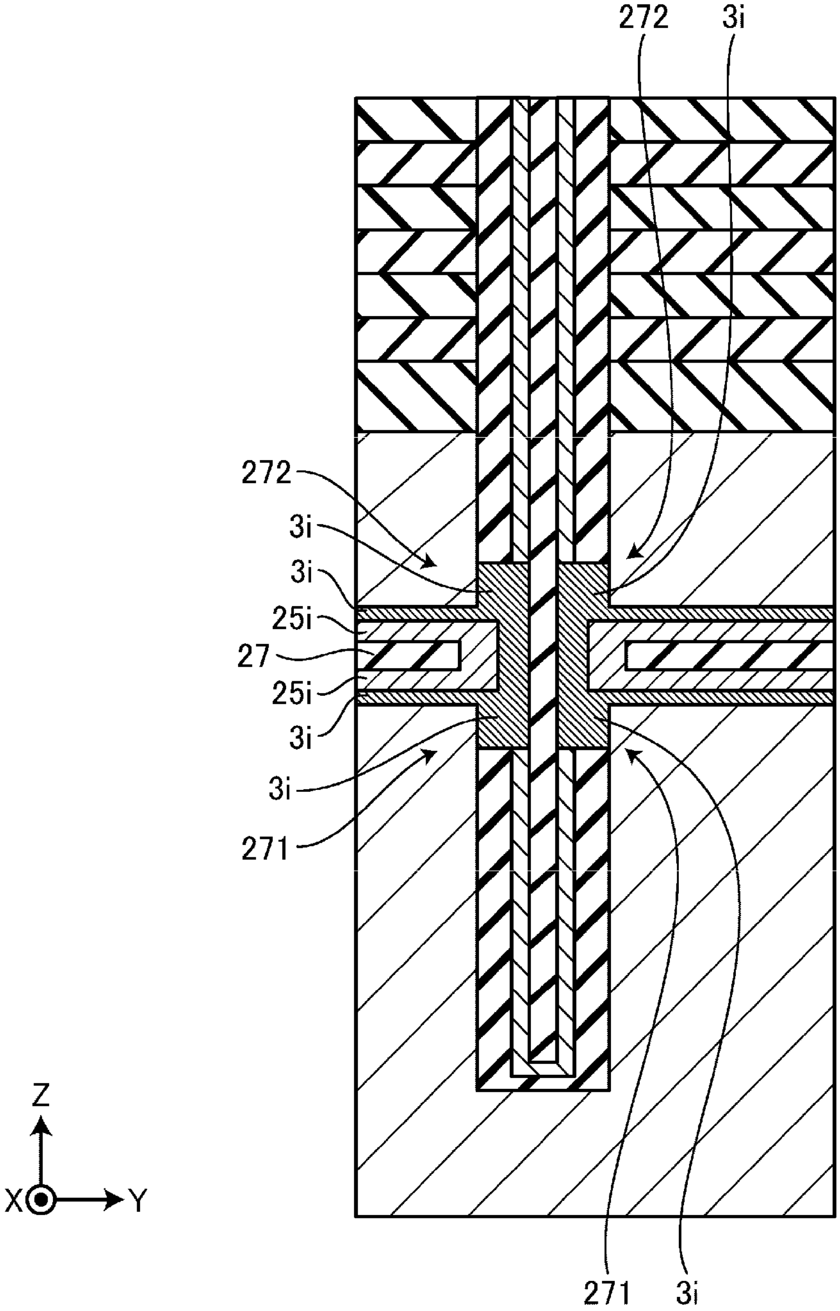

In the process shown in FIG. 12, a conductive film 3$i$ and a conductive film 25$i$ are deposited on the exposed surface of the void 27 and the grooves 271 and 272 by a CVD method or the like. The conductive film 3$i$ may be formed of a polycrystalline semiconductor (for example, polysilicon) containing an N-type impurity and carbon. The conductive film 25$i$ may be formed of a polycrystalline semiconductor (for example, polysilicon) containing an N-type impurity. Consequently, the conductive film 3$i$ is embedded into the grooves 271 and 272.

Figure 13:
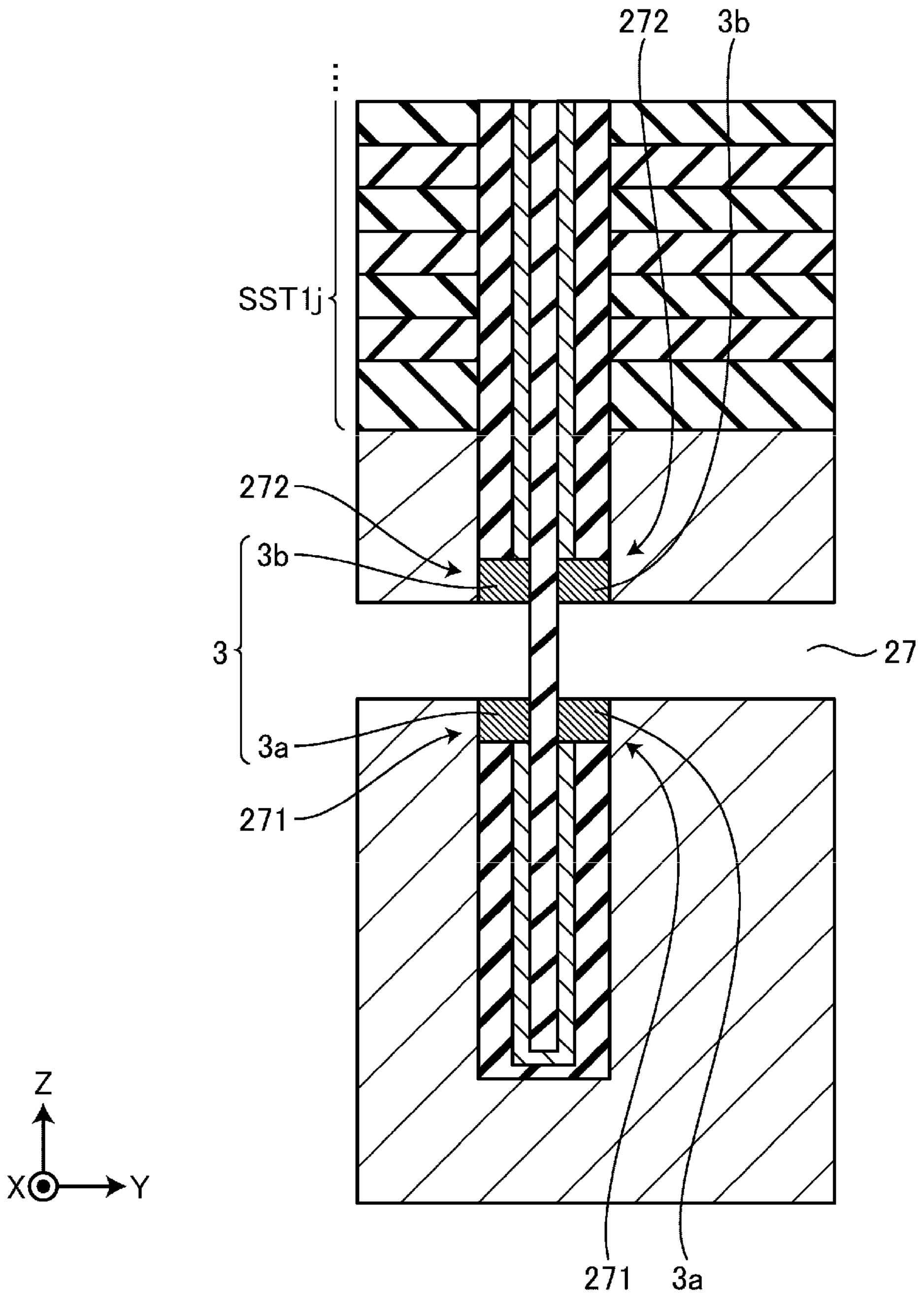

In the process shown in FIG. 13, the conductive film 3$i$ and the conductive film 25$i$ are etched back by isotropic etching such as wet etching. The etching amount in the etch back is controlled by an etching time or the like. Consequently, the other portions of the conductive film 3$i$ and the conductive film 25$i$ are removed while the portions of the conductive film 3$i$ embedded in the grooves 271 and 272 (see FIG. 12) are left as the conductive film 3. In the conductive film 3, the portion embedded in the groove 271 on the −Z side of the void 27 is left as the conductive film 3$a$, and the portion embedded in the groove 272 on the +Z side of the void 27 is left as the conductive film 3$b$.

Figure 14:
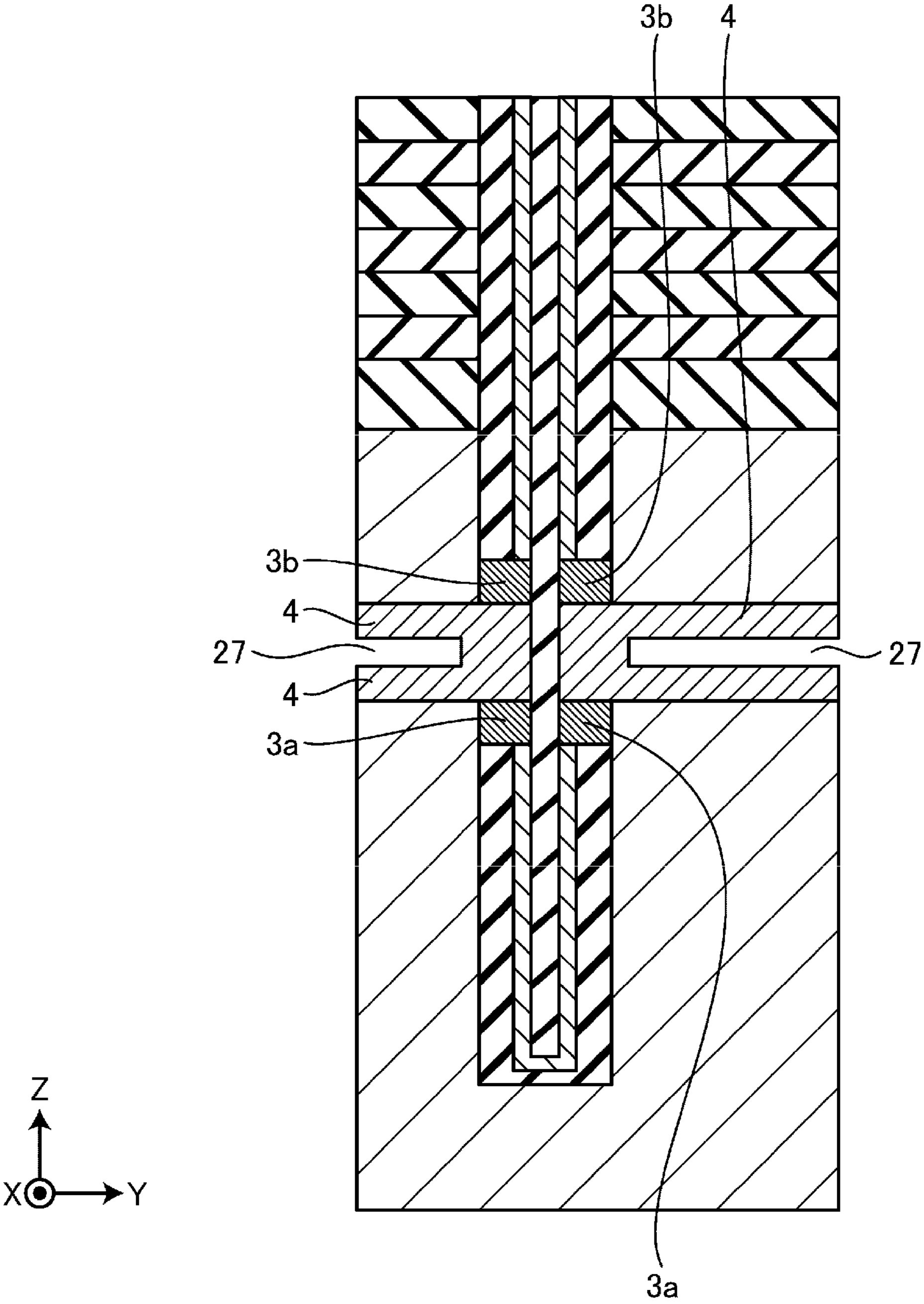

In the process shown in FIG. 14, the conductive film 4 is deposited on the exposed surface of the void 27 by a CVD method or the like. The conductive film 4 may be formed of a polycrystalline semiconductor (for example, polysilicon) containing an N-type impurity. Consequently, the exposed surface of the void 27 is covered with the conductive film 4.

Figure 15:
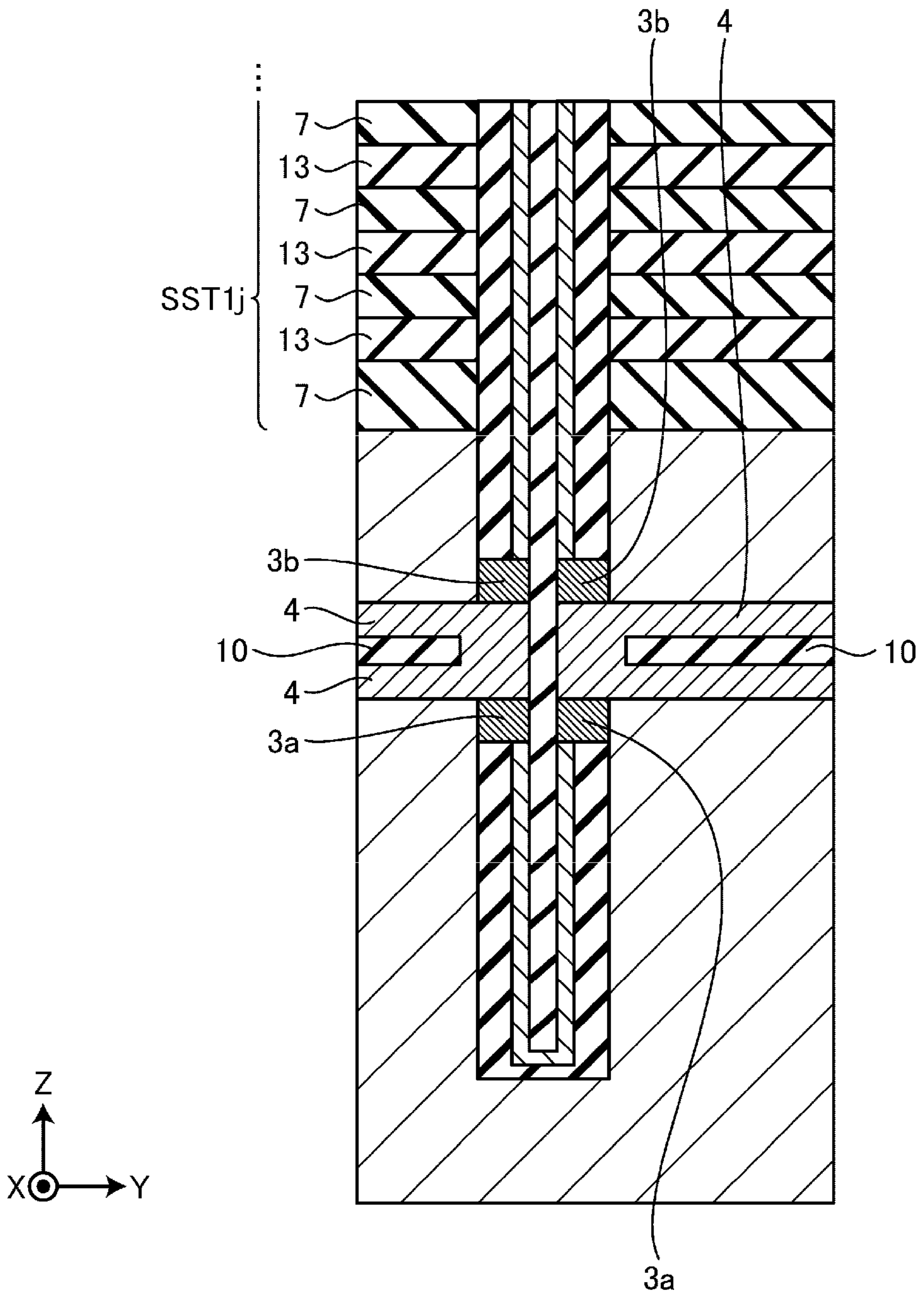

In the process shown in FIG. 15, an insulating substance is embedded into the void 27 by a CVD method or the like to form the core insulating film 10.

Figure 16:
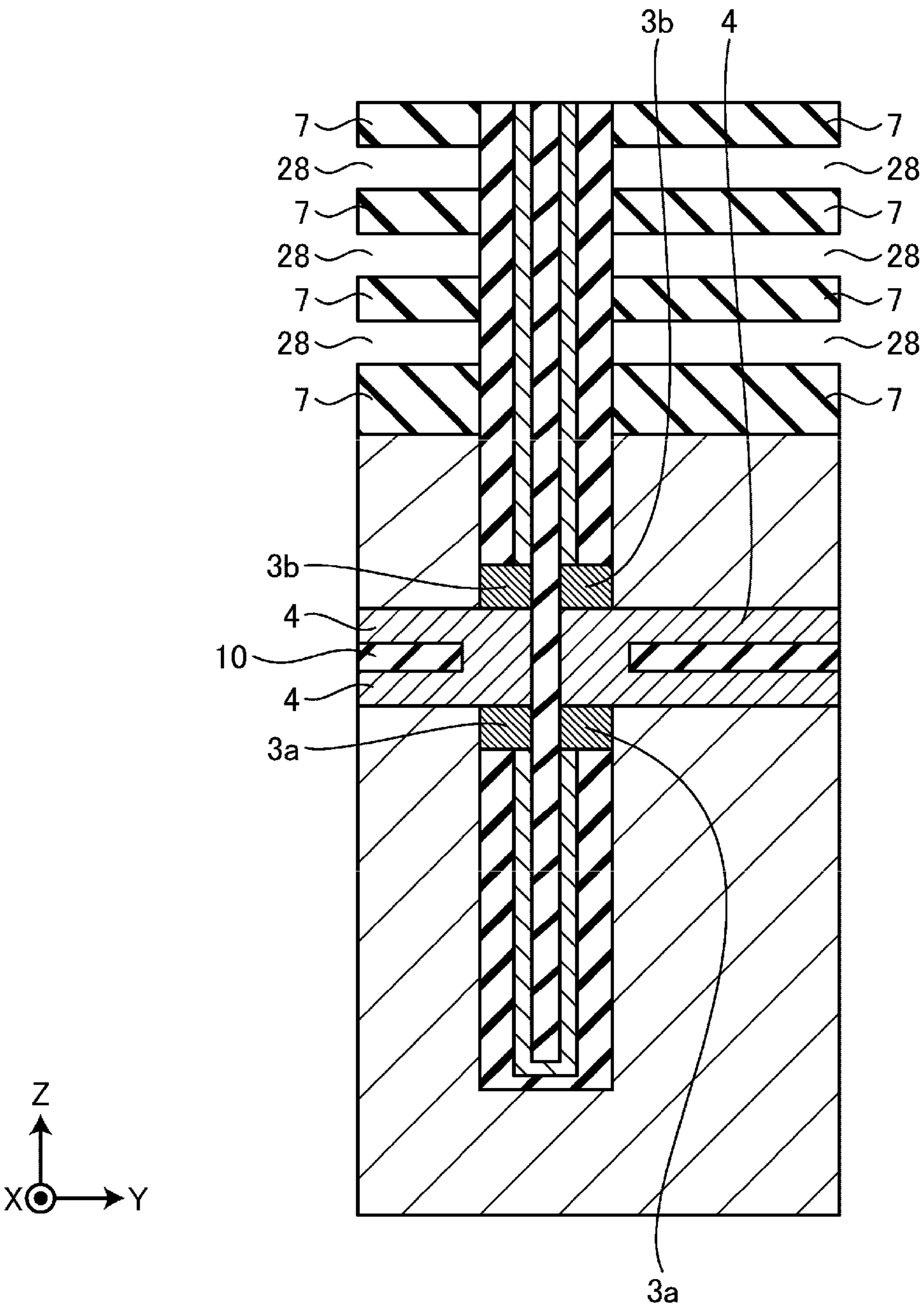

In the process shown in FIG. 16, a sacrificial layer 13 in the stacked body SST1$j$ is removed by isotropic etching such as wet etching, and a void 28 is formed. Then, the insulating film 8 (see FIGS. 5A and 5B) that covers the exposed surface of the void 28 is formed. The insulating film 8 may be formed of an insulating substance such as an aluminum oxide.

Figure 17:
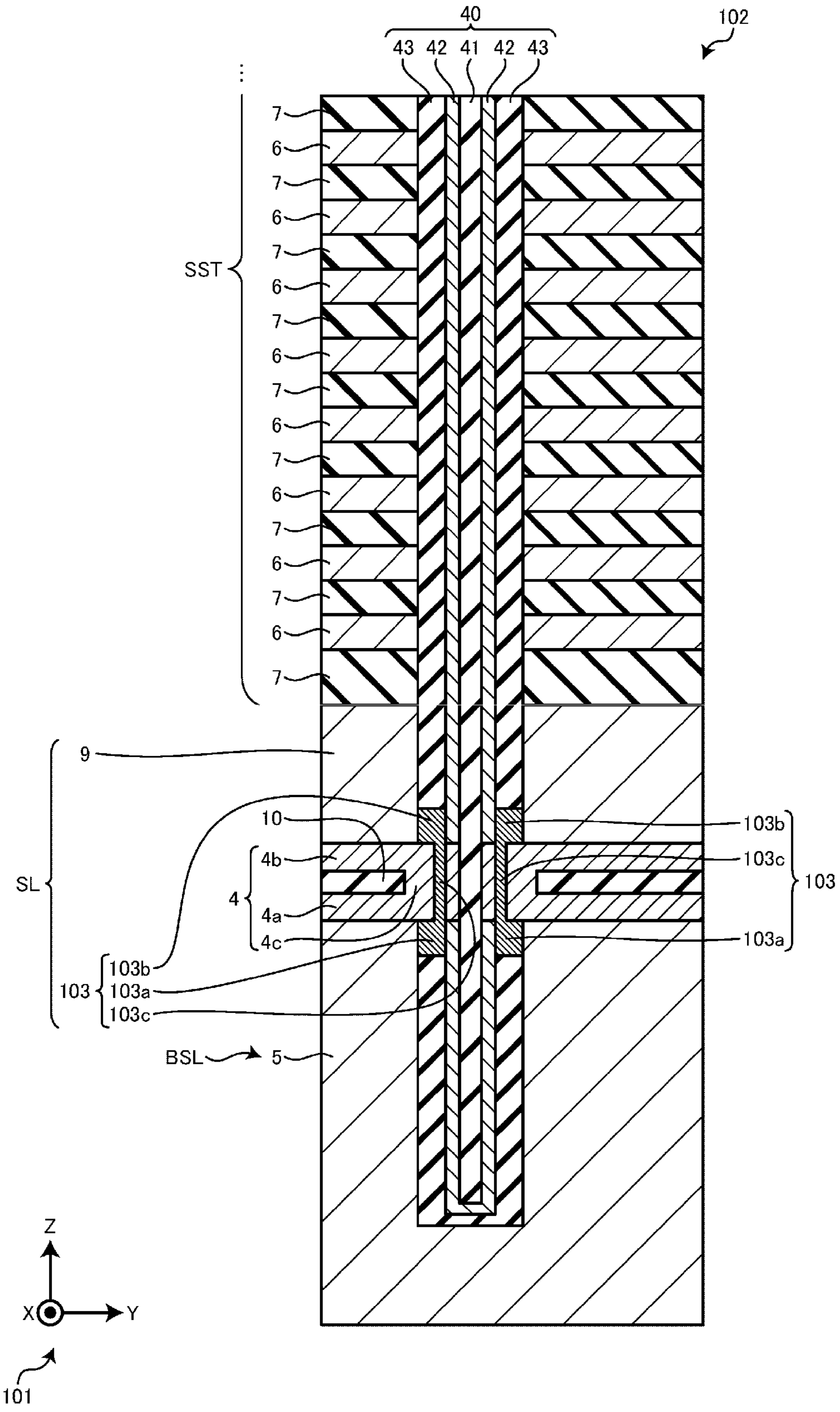
FIG. 17 is a cross-sectional view showing a configuration of a memory cell array in a second embodiment.

In the process shown in FIG. 17, a conductive substance is embedded into the void 28, and the conductive layers 6 are formed. Each conductive layer 6 is formed of a material containing a metal such as tungsten as a main component. Consequently, the stacked body SST in which the plurality of insulating layers 7 and the plurality of conductive layers 6 are alternately stacked is formed. That is, the semiconductor memory device 1 including the stacked body SST is formed.

As described above, in the first embodiment, the DSC structure in which the source line SL is in contact with the semiconductor film 42 is provided in the semiconductor memory device 1. In the DSC structure, in the conductive films 3 and 4 functioning as the source line SL, the conductive film 3$b$ is in contact with the conductive film 4 on the −Z side and is in contact with one end of the semiconductor film 42 on the +Z side. The conductive film 4 contains a polycrystalline semiconductor containing an impurity. The conductive film 3$b$ contains a polycrystalline semiconductor containing an impurity and carbon. Accordingly, the average grain size of the polycrystalline semiconductor in the conductive film 3*b* is smaller than the average grain size of the polycrystalline semiconductor in the conductive film 4. Consequently, the amount of impurities diffused from the semiconductor films 5 and 9 and the conductive film 4 to the semiconductor film 42 through the conductive film 3*b* can be properly controlled. As a result, since it is possible to improve the efficiency of GIDL generation at the select gate SGSB during the erasing operation and to properly turn on and off the select gate SGS, the operational reliability of the semiconductor memory device 1 can be improved.

For example, when the conductive film 4 is in direct contact with the side surface of the semiconductor film 42, as indicated by an alternate long and short dash line in FIG. 6A, the concentration is relatively high in a portion in contact with the conductive film 4, but tends to decrease as it approaches the Z position of the channel region of the select gate SGSB.

At this time, the average grain size of the polycrystalline semiconductor in the conductive film 4 (the conductive film 4*a*, the conductive film 4*b*, and the conductive film 4*c*) is relatively large. Consequently, the amount of N-type impurities diffused from the semiconductor films 5 and 9 and the conductive film 4 to the semiconductor film 42 may be excessive.

That is, as indicated by the alternate long and short dash line in FIG. 6A, in the semiconductor film 42, the channel region of the select gate SGS contains an N-type impurity at a concentration equal to or higher than the threshold concentration Cth. This makes it difficult to properly turn on and off the select gate SGS, such as the select gate SGS being turned on when non-selected, and the operational reliability of the semiconductor memory device 1 may deteriorate.

By contrast, in the first embodiment, the average grain size of the polycrystalline semiconductor in the conductive film 3*b* is smaller than the average grain size of the polycrystalline semiconductor in the conductive film 4. Consequently, the amount of impurities diffused from the semiconductor films 5 and 9 and the conductive film 4 to the semiconductor film 42 through the conductive film 3*b* can be properly controlled. For example, as indicated by the solid line in FIG. 6A, in the semiconductor film 42, the N-type impurity is contained in the channel region of the select gate SGSB at a concentration equal to or higher than a threshold concentration Cth, but the N-type impurity is reduced to a concentration less than the threshold concentration Cth in the channel region of the select gate SGS. As a result, since it is possible to improve the efficiency of GIDL generation at the select gate SGSB during the erasing operation and to properly turn on and off the select gate SGS, the operational reliability of the semiconductor memory device 1 can be improved.

Second Embodiment

Next, a semiconductor memory device 101 according to a second embodiment will be described. Hereinafter, portions different from the first embodiment will be mainly described.

As the DSC structure, in the first embodiment, the conductive film 3 containing carbon is sandwiched between one end of the semiconductor film 42 and the +Z side main surface of the conductive film 4, but in the second embodiment, a conductive film 103 containing carbon is sandwiched between the side surface of the semiconductor film 42 and the end portion of the conductive film 4.

In the semiconductor memory device 101, a memory cell array 102 includes the conductive film 103 instead of the conductive film 3, as shown in FIG. 17. FIG. 17 is a YZ sectional view showing a configuration of the memory cell array 102.

The conductive film 103 is disposed between the conductive film 4 and the semiconductor film 42 in the XY direction. The conductive film 103 is sandwiched between the side surface of the semiconductor film 42 and the end portion of the conductive film 4. A side surface (inner side surface) of the conductive film 103 on the core member 41 side is in contact with the side surface of the semiconductor film 42, and a side surface (outer side surface) thereof on the opposite side is in contact with the end portion of the conductive film 4.

The conductive film 103 includes a conductive film 103*a*, a conductive film 103*b*, and a conductive film 103*c*. A +Z side main surface of the conductive film 103*a* is in contact with the end portion of the conductive film 4 and is connected to the conductive film 103*c*, and a side surface (inner side surface) thereof on the core member 41 side is in contact with the side surface of the semiconductor film 42. A-Z side main surface of the conductive film 103*b* is in contact with the end portion of the conductive film 4 and is connected to the conductive film 103*c*, and a side surface (inner side surface) thereof on the core member 41 side is in contact with the side surface of the semiconductor film 42. A side surface of the conductive film 103*c* on the core member 41 side is in contact with the side surface of the semiconductor film 42, a side surface thereof on the opposite side is in contact with the end surface of the conductive film 4, a −Z side end portion thereof is connected to the conductive film 103*a*, and a +Z side end portion is connected to the conductive film 103*b*.

The conductive film 103*a*, the conductive film 103*b*, and the conductive film 103*c* are the same as the conductive film 3*a* and the conductive film 3*b* of the first embodiment in that each of the conductive film 103*a*, the conductive film 103*b*, and the conductive film 103*c* is formed of a material containing a polycrystalline semiconductor (for example, polysilicon) as a main component and contains an N-type impurity (for example, phosphorus or arsenic) at the fourth concentration.

The conductive film 103*a*, the conductive film 103*b*, and the conductive film 103*c* are also the same as the conductive film 3*a* and the conductive film 3*b* of the first embodiment in that each of the conductive film 103*a*, the conductive film 103*b*, and the conductive film 103*c* further contains carbon at the fifth concentration. Accordingly, the average grain size of the polycrystalline semiconductor in the conductive film 103*a*, the conductive film 103*b*, and the conductive film 103*c* is smaller than the average grain size of the polycrystalline semiconductor in the conductive film 4*a*, the conductive film 4*b*, and the conductive film 4*c*.

In addition, a method of manufacturing the semiconductor memory device 101 is different from that of the first embodiment in the following points as shown in FIGS. 18 to 23 and FIG. 17. FIGS. 18 to 23 are YZ sectional views showing the method of manufacturing the semiconductor memory device 101. FIG. 17 is a YZ sectional view showing the structure of the semiconductor memory device 101 and is also used as a cross-sectional view showing the manufacturing method.

Figure 18:
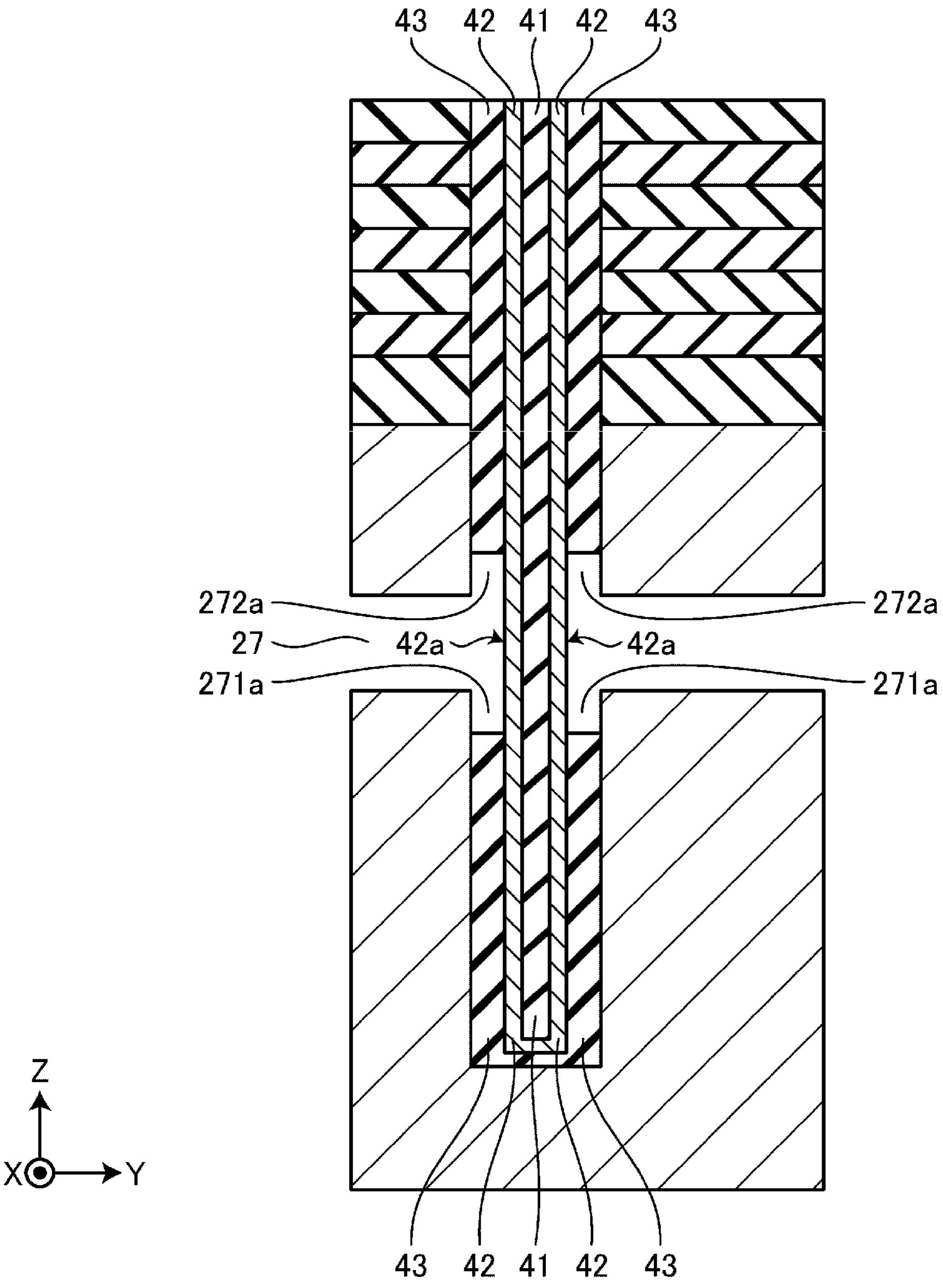
FIGS. 18-23 are cross-sectional views showing a method of manufacturing the semiconductor memory device according to the second embodiment.

After the processes of FIGS. 7 to 10 are performed in the same manner as in the first embodiment, the process shown in FIG. 18 is performed.

The process shown in FIG. 18 is performed on the structure shown in FIG. 10. In this process, the insulating layers 21 and 22 are removed by isotropic etching such as wet etching, a portion of the insulating film 43*i* in the vicinity of the exposed surface is removed, a part of an outer side surface 42*a* of the semiconductor film 42 is exposed, and grooves 271*a* and 272*a* are formed along the outer side surface 42*a*. The groove 271*a* extends in the −Z direction along the outer side surface 42*a* of the semiconductor film 42 from the void 27. The groove 271*a* has a substantially cylindrical shape. The groove 272*a* extends in the +Z direction along the outer side surface 42*a* of the semiconductor film 42 from the void 27. The groove 272*a* has a substantially cylindrical shape. The groove 271*a*, the groove 272*a*, and the void 27 surround the semiconductor film 42 in the XY plane view.

Figure 19:
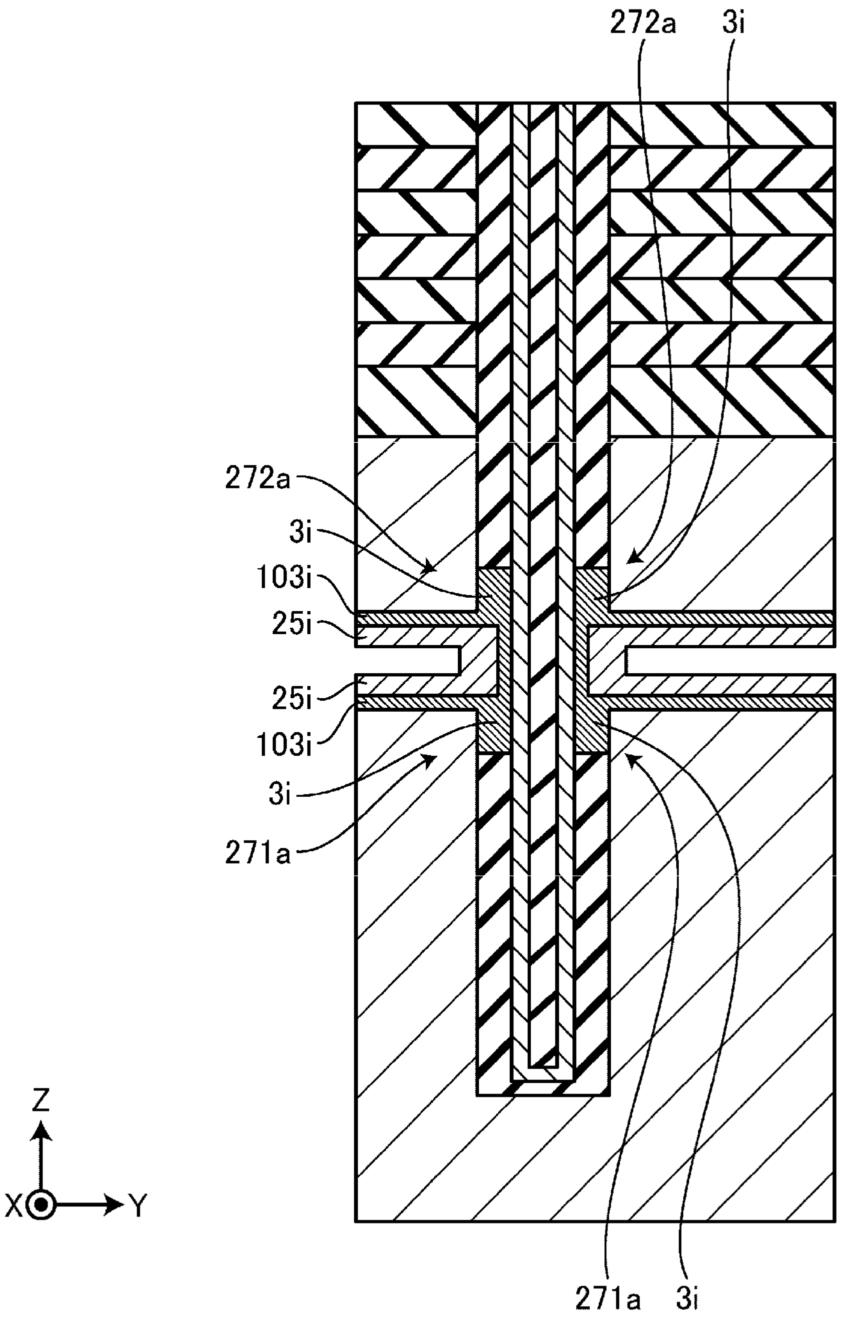

In the process shown in FIG. 19, a conductive film 103*i* and the conductive film 25*i* are deposited on the exposed surface of the void 27 and the grooves 271*a* and 272*a* (see FIG. 18) by a CVD method or the like. The conductive film 103*i* may be formed of a polycrystalline semiconductor (for example, polysilicon) containing an N-type impurity and carbon. The conductive film 25*i* may be formed of a polycrystalline semiconductor (for example, polysilicon) containing an N-type impurity. Consequently, the conductive film 103*i* is embedded into the grooves 271*a* and 272*a*.

Figure 20:
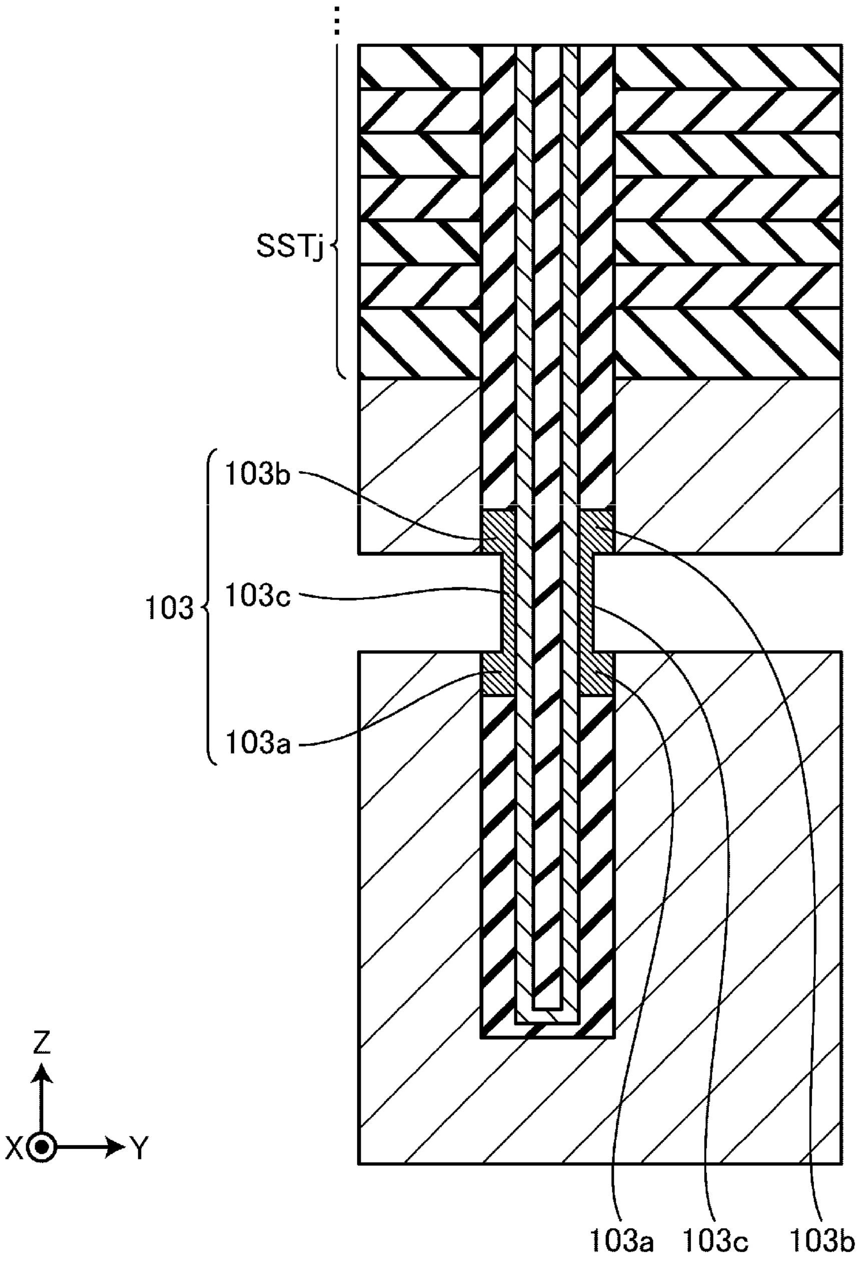

In the process shown in FIG. 20, the conductive film 103*i* and the conductive film 25*i* are etched back by isotropic etching such as wet etching. The etching amount in the etch back is controlled by an etching time or the like. Consequently, the other portions of the conductive film 103*i* and the conductive film 25*i* are removed while the portions of the conductive film 103*i* embedded in the grooves 271*a* and 272*a* (see FIG. 18) and the portion thereof between the grooves 271*a* and 272*a* are left as the conductive film 103. In the conductive film 103, the portion embedded in the groove 271*a* on the −Z side of the void 27 is left as the conductive film 103*a*, the portion embedded in the groove 272*a* on the +Z side of the void 27 is left as the conductive film 103*b*, and the portion between the grooves 271*a* and 272*a* is left as the conductive film 103*c*.

Figure 21:
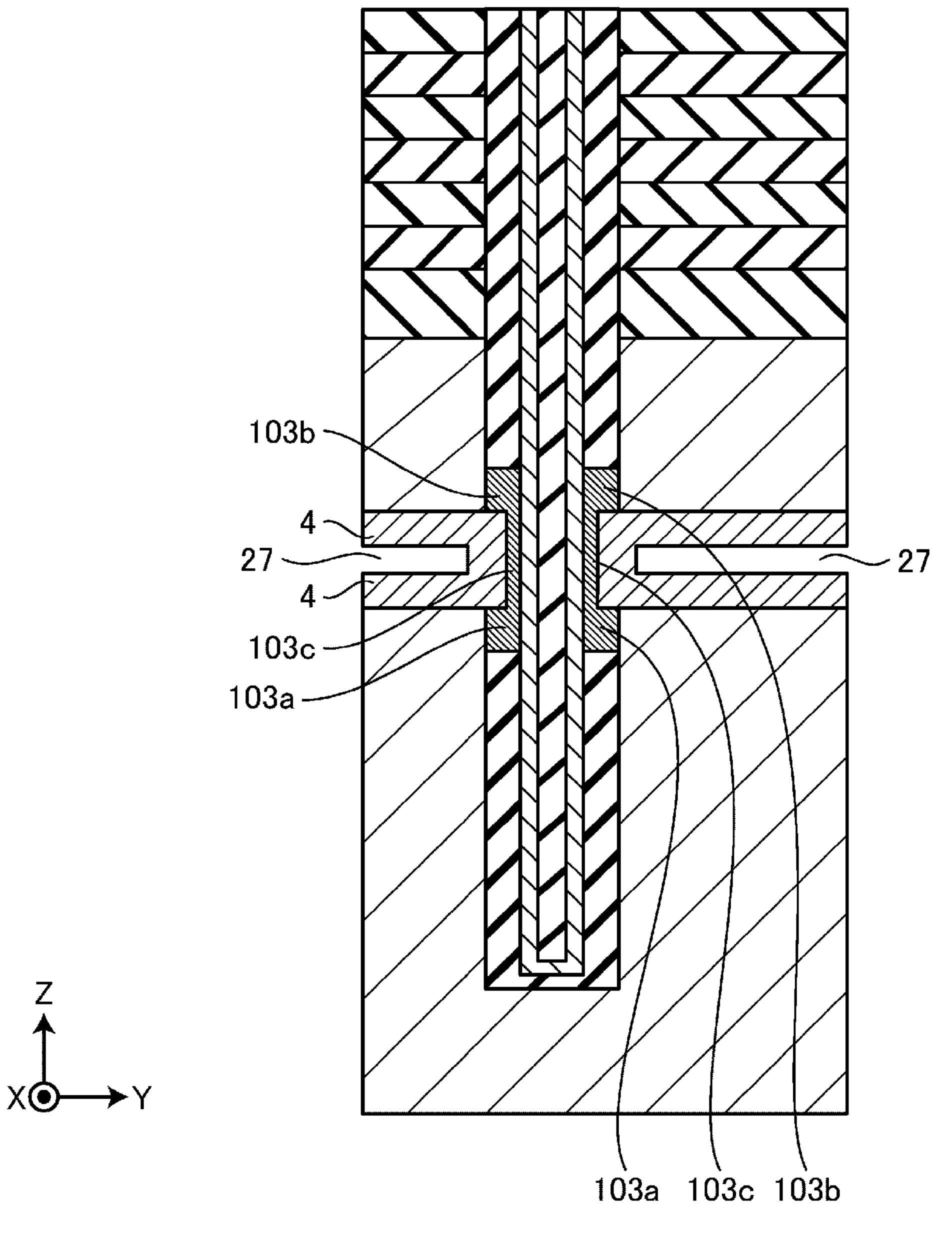

In the process shown in FIG. 21, the conductive film 4 is deposited on the exposed surface of the void 27 by a CVD method or the like. The conductive film 4 may be formed of a polycrystalline semiconductor (for example, polysilicon) containing an N-type impurity. Consequently, the outer side surface of the conductive film 103*c* is covered with the conductive film 4, and the exposed surface of the void 27 is covered with the conductive film 4.

Figure 22:
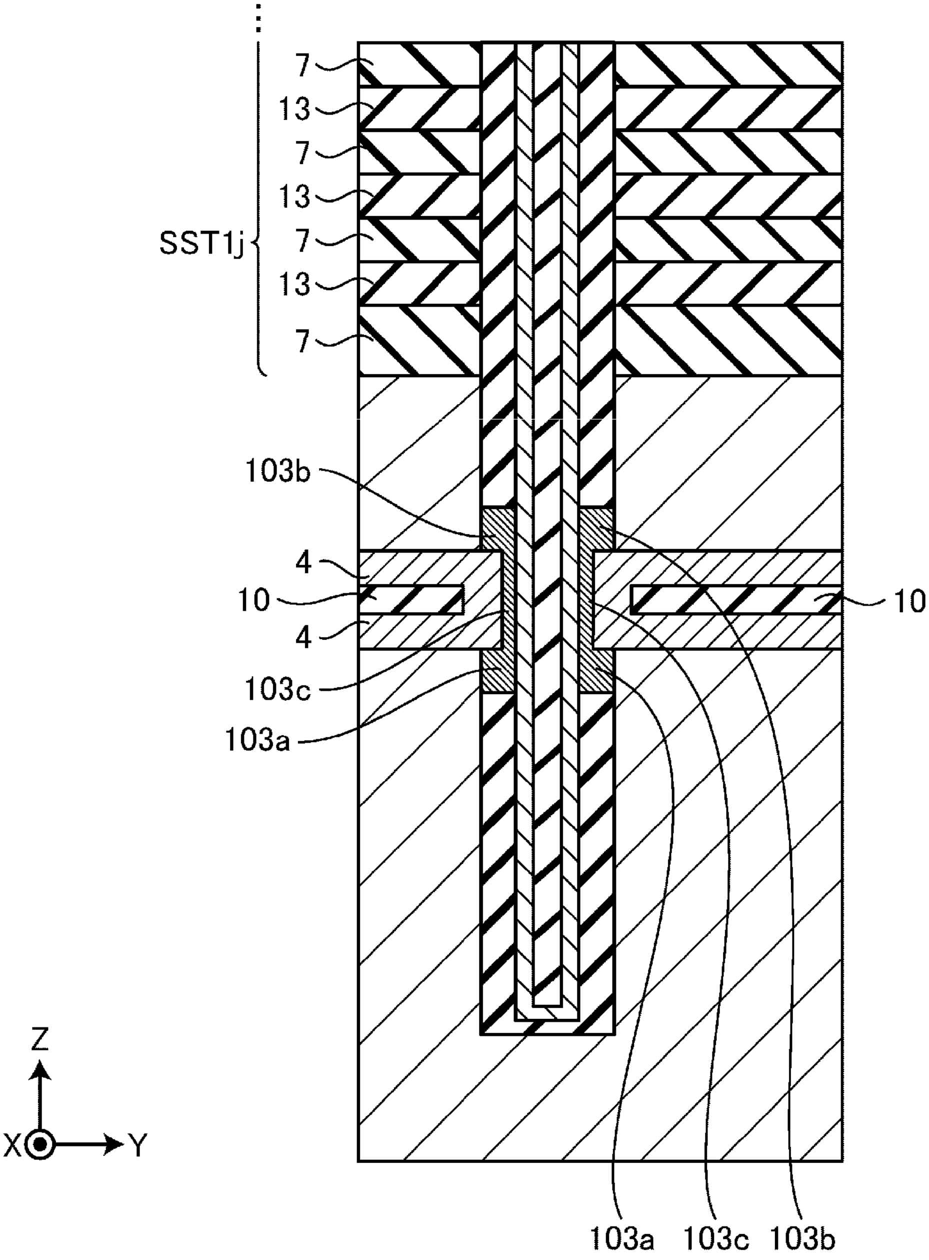

In the process shown in FIG. 22, an insulating substance is embedded into the void 27 by a CVD method or the like to form the core insulating film 10.

Figure 23:
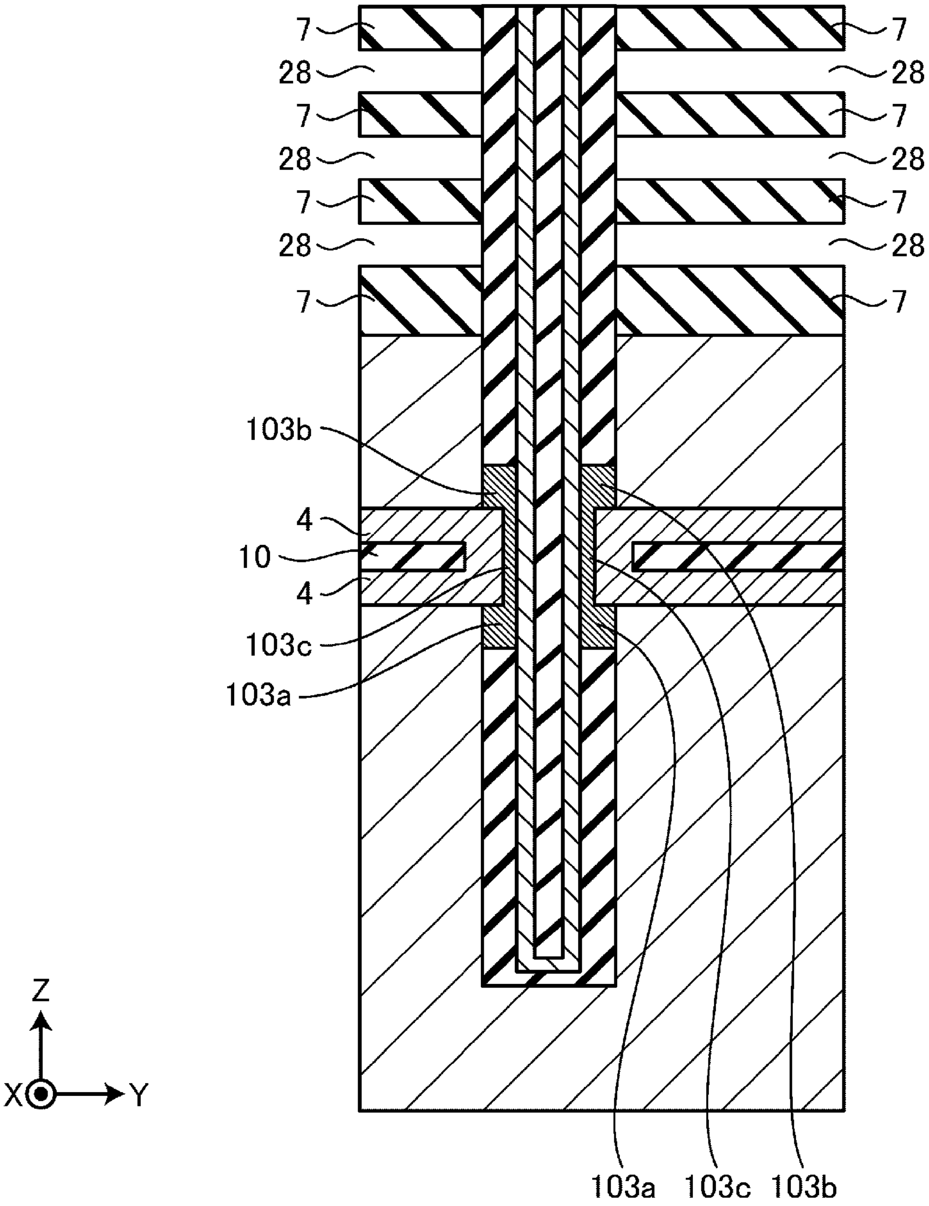

In the process shown in FIG. 23, the sacrificial layer 13 in the stacked body SST1*j* is removed by isotropic etching such as wet etching, and the void 28 is formed. Then, the insulating film 8 (see FIGS. 5A and 5B) that covers the exposed surface of the void 28 is formed. The insulating film 8 may be formed of an insulating substance such as an aluminum oxide.

In the process shown in FIG. 17, a conductive substance is embedded into the void 28, and the conductive layer 6 is formed. The conductive layer 6 is formed of a material containing a metal such as tungsten as a main component. Consequently, the stacked body SST in which the plurality of insulating layers 7 and the plurality of conductive layers 6 are alternately stacked is formed. That is, the semiconductor memory device 101 including the stacked body SST is formed.

As described above, in the second embodiment, the DSC structure in which the source line SL is in contact with the semiconductor film 42 is provided in the semiconductor memory device 101. In the DSC structure, in the conductive films 103 and 4 functioning as the source line SL, the side surface (inner side surface) of the conductive film 103*c* on the core member 41 side is in contact with the side surface of the semiconductor film 42, and the side surface (outer side surface) thereof on the opposite side is in contact with the end portion of the conductive film 4. The conductive film 4 contains a polycrystalline semiconductor containing an impurity. The conductive film 103*c* contains a polycrystalline semiconductor containing an impurity and carbon. Accordingly, the average grain size of the polycrystalline semiconductor in the conductive film 103*c* is smaller than the average grain size of the polycrystalline semiconductor in the conductive film 4. Consequently, the amount of impurities diffused from the semiconductor films 5 and 9 and the conductive film 4 to the semiconductor film 42 through the conductive film 103*c* can be properly controlled. As a result, since it is possible to improve the efficiency of GIDL generation at the select gate SGSB during the erasing operation and to properly turn on and off the select gate SGS, the operational reliability of the semiconductor memory device 101 can be improved.

Third Embodiment

Next, a semiconductor memory device 201 according to a third embodiment will be described. Hereinafter, portions different from the first embodiment and the second embodiment will be mainly described.

As the DSC structure, in the second embodiment, the conductive film 4 is separated from the semiconductor film 42 by the conductive film 103, but in the third embodiment, a conductive film 204 is not in direct contact with the side surface of the semiconductor film but is in direct contact with one end of the semiconductor film 42.

Figure 24:
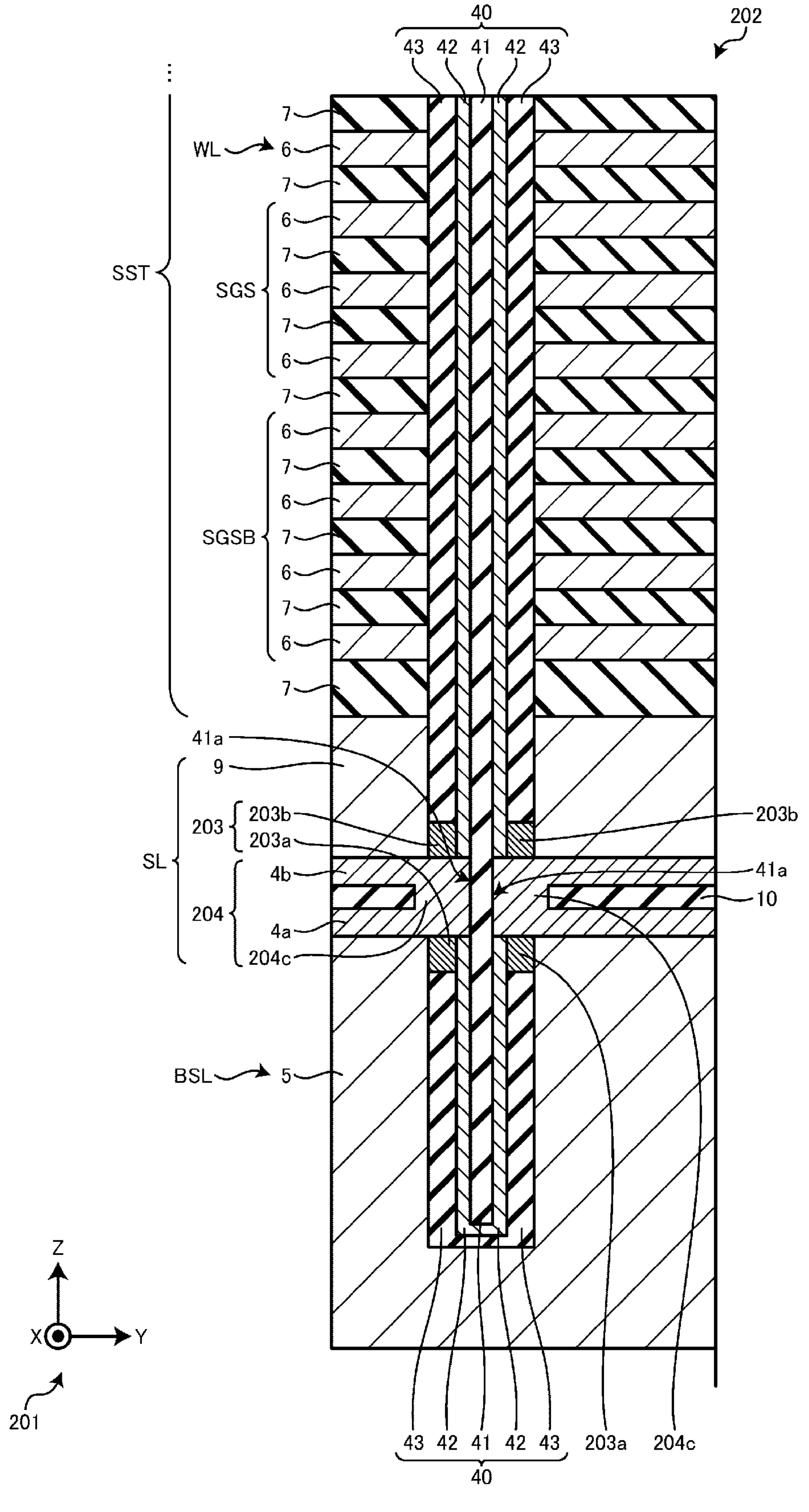
FIG. 24 is a cross-sectional view showing a configuration of a memory cell array in a third embodiment.

In the semiconductor memory device 201, a memory cell array 202 includes the conductive film 203 and the conductive film 204 instead of the conductive film 3 and the conductive film 4, as shown in FIG. 24. FIG. 24 is a YZ sectional view showing a configuration of the memory cell array 202.

The conductive film 204 is penetrated by the columnar body 40 in the Z direction. The conductive film 204 is not in direct contact with the side surface of the semiconductor film 42 but is in direct contact with one end of the semiconductor film 42. A portion of the conductive film 204 close to the core member 41 is in contact with the semiconductor film 42 on both sides in the Z direction, and a portion thereof farther from the core member 41 is in contact with the conductive film 203 on both sides in the Z direction.

The conductive film 204 includes a conductive film 204*c* instead of the conductive film 4*c* (see FIG. 17). The conductive film 204*c* covers the outer side surface 41*a* of the core member 41. At the position corresponding to the columnar body 40 in the XY plane, a +Z side main surface of the conductive film 204*c* is in contact with the semiconductor film 42 and the conductive film 203, and a −Z side main surface thereof is in contact with the semiconductor film 42 and the conductive film 203.

The conductive film 4*a*, the conductive film 4*b*, and the conductive film 204*c* are the same as the conductive film 4*a*, the conductive film 4*b*, and the conductive film 4*c* of the first embodiment in that each of the conductive film 4*a*, the conductive film 4*b*, and the conductive film 204*c* is formed of a material containing a polycrystalline semiconductor (for example, polysilicon) as a main component and contains an N-type impurity (for example, phosphorus or arsenic) at the second concentration.

The conductive film 203 is disposed between the conductive film 204 and the semiconductor film 42 and the semiconductor film 43. The conductive film 203 is in contact with each of the side surface of the semiconductor film 42 and the end portion of the conductive film 204.

The conductive film 203 includes a conductive film 203*a* and a conductive film 203*b*. A side surface (inner side surface) of the conductive film 203*a* on the core member 41 side is in contact with the side surface of the semiconductor film 42, and a +Z side main surface thereof is in contact with the end portion of the conductive film 204. A side surface (inner side surface) of the conductive film 203*b* on the core member 41 side is in contact with the side surface of the semiconductor film 42, and a −Z side main surface thereof is in contact with the end portion of the conductive film 204.

The conductive film 203*a* and the conductive film 203*b* are the same as the conductive film 3*a* and the conductive film 3*b* of the first embodiment in that each of the conductive film 203*a* and the conductive film 203*b* is formed of a material containing a polycrystalline semiconductor (for example, polysilicon) as a main component and contains an N-type impurity (for example, phosphorus or arsenic) at the fourth concentration.

The conductive film 203*a* and the conductive film 203*b* are also the same as the conductive film 3*a* and the conductive film 3*b* of the first embodiment in that each of the conductive film 203*a* and the conductive film 203*b* further contains carbon at the fifth concentration. Accordingly, the average grain size of the polycrystalline semiconductor in the conductive film 203*a* and the conductive film 203*b* is smaller than the average grain size of the polycrystalline semiconductor in the conductive film 4*a*, the conductive film 4*b*, and the conductive film 204*c*.

In addition, a method of manufacturing the semiconductor memory device 201 is different from the first embodiment and the second embodiment in the following points as shown in FIGS. 25 to 28 and 24. FIGS. 25 to 28 are cross-sectional views showing the method of manufacturing the semiconductor memory device 201. FIG. 24 is a cross-sectional view showing the structure of the semiconductor memory device 201 and is also used as a cross-sectional view showing the manufacturing method.

Figure 25:
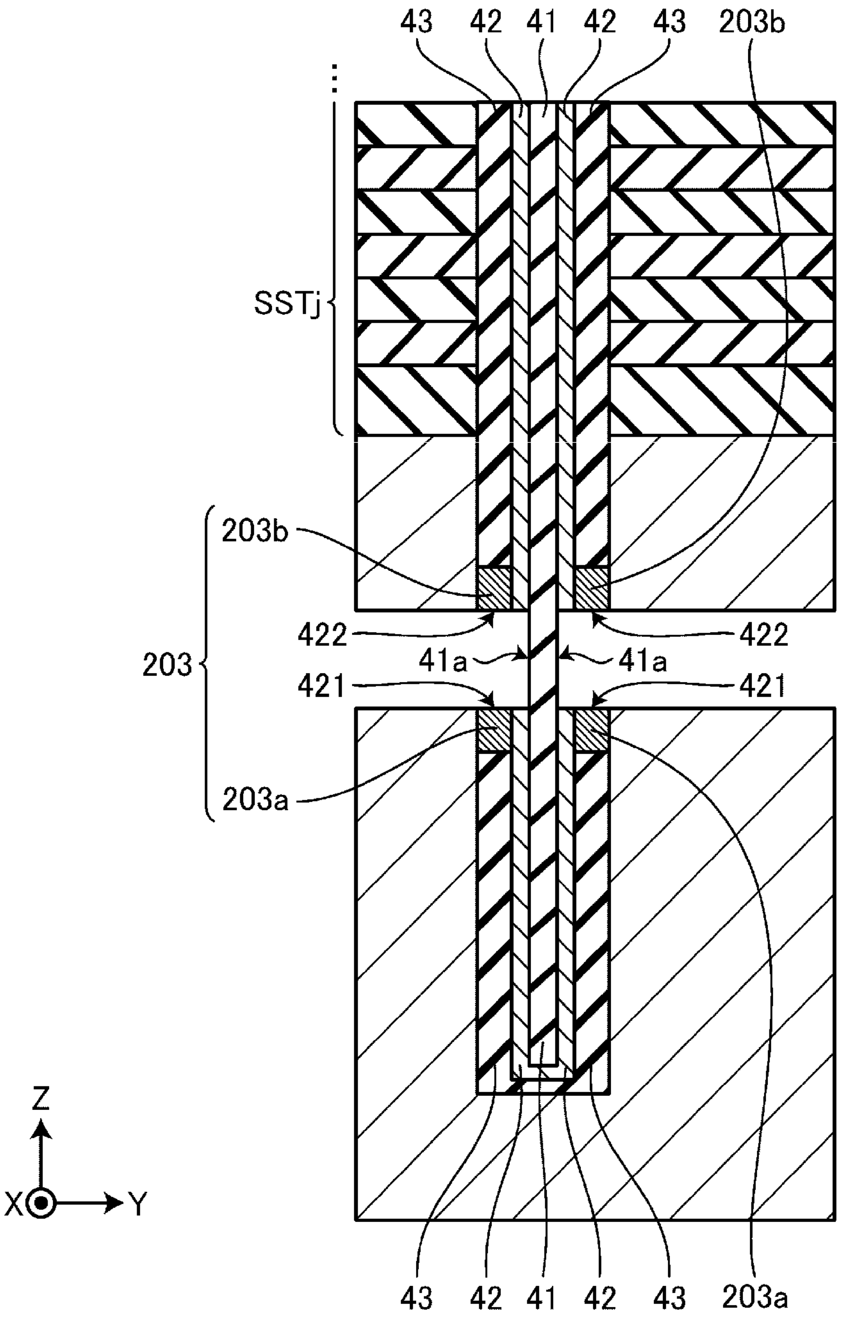
FIGS. 25-28 are cross-sectional views showing a method of manufacturing the semiconductor memory device according to the third embodiment.

After the processes in FIGS. 7 to 10 are performed in the same manner as in the first embodiment, and the processes shown in FIGS. 18 and 19 are performed in the same manner as in the second embodiment, the process shown in FIG. 25 is performed.

The process shown in FIG. 25 is performed on the structure shown in FIG. 19. In this process, the conductive film 103*i* and the conductive film 25*i* (see FIG. 19) are etched back by isotropic etching such as wet etching. The etching amount in the etch back is controlled by an etching time or the like. Consequently, the other portions of the conductive film 103*i* and the conductive film 25*i* are removed while the portions of the conductive film 103*i* embedded in the grooves 271*a* and 272*a* (see FIG. 18) are left as the conductive film 203. The portion of the conductive film 103*i* between the grooves 271*a* and 272*a* is also removed, and the outer side surface 41*a* of the core member 41, the +Z side end 421 of the semiconductor film 42 on the −Z side, and the −Z side end 422 of the semiconductor film 42 on the +Z side are exposed. In the conductive film 203, the portion embedded in the groove 271*a* on the −Z side of the void 27 is left as the conductive film 203*a*, and the portion embedded in the groove 272*a* on the +Z side of the void 27 is left as the conductive film 203*b*.

Figure 26:
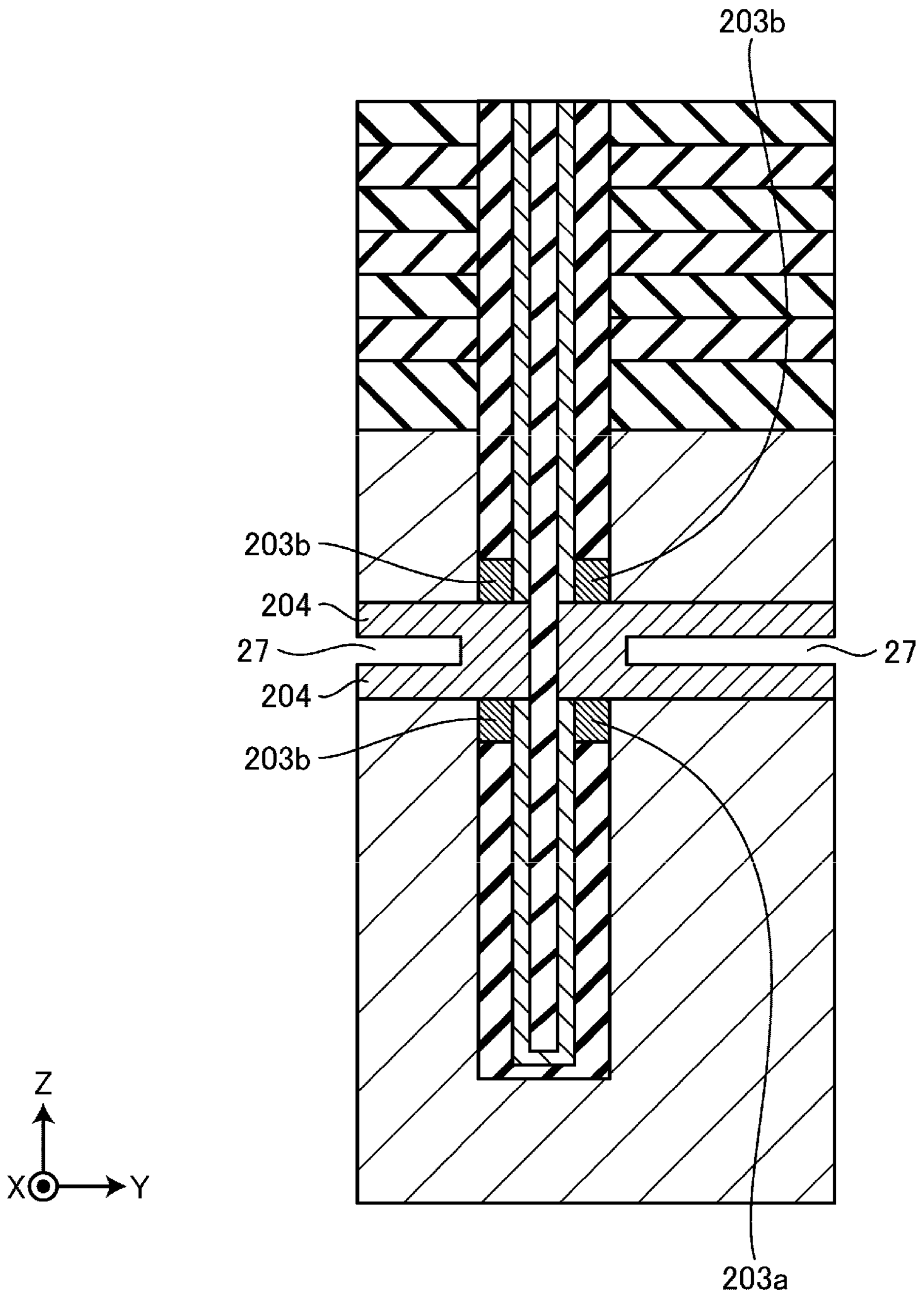

In the process shown in FIG. 26, the conductive film 204 is deposited on the exposed surface of the void 27 by a CVD method or the like. The conductive film 204 may be formed of a polycrystalline semiconductor (for example, polysilicon) containing an N-type impurity.

Figure 27:
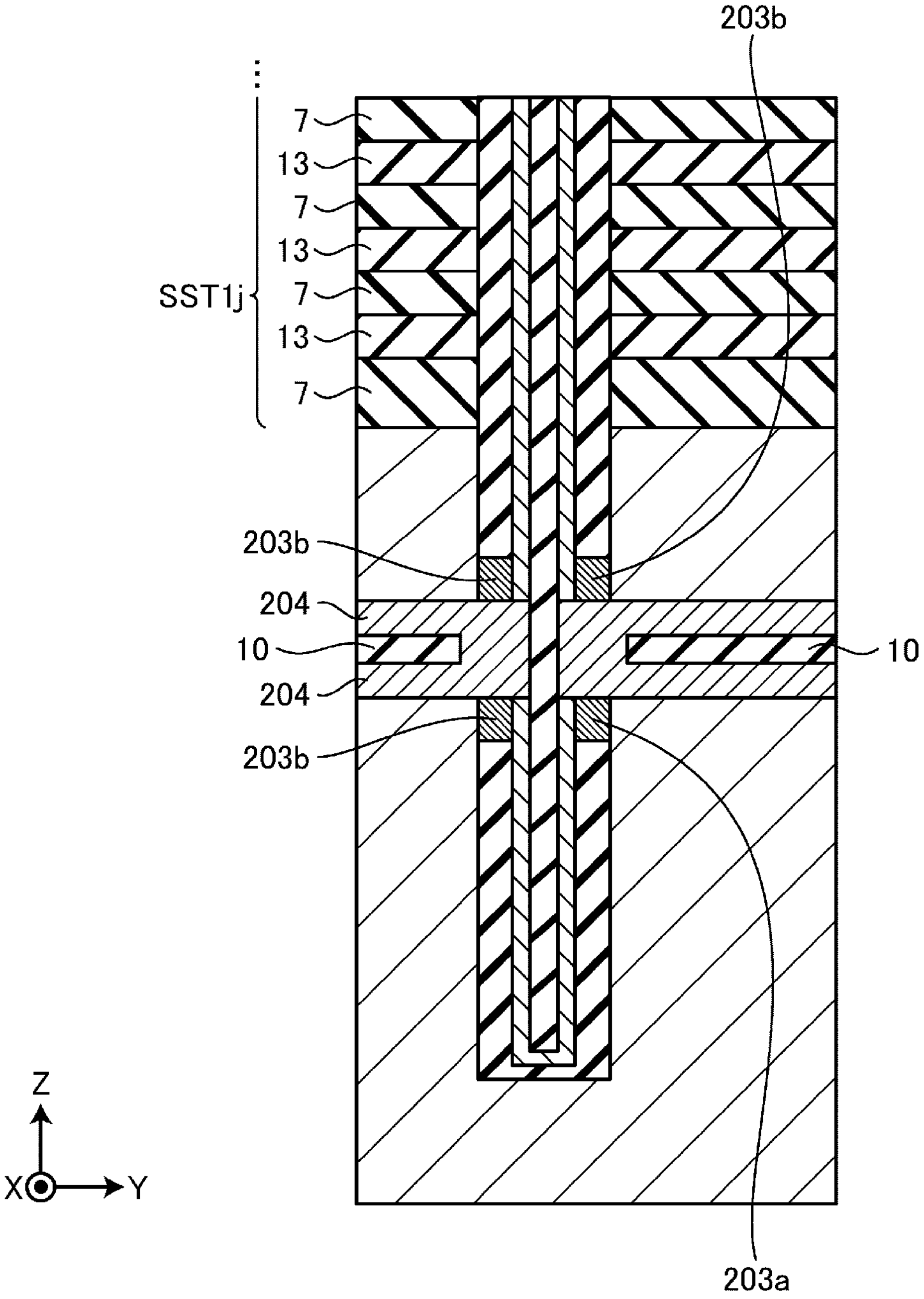

In the process shown in FIG. 27, an insulating substance is embedded into the void 27 by a CVD method or the like to form the core insulating film 10.

Figure 28:
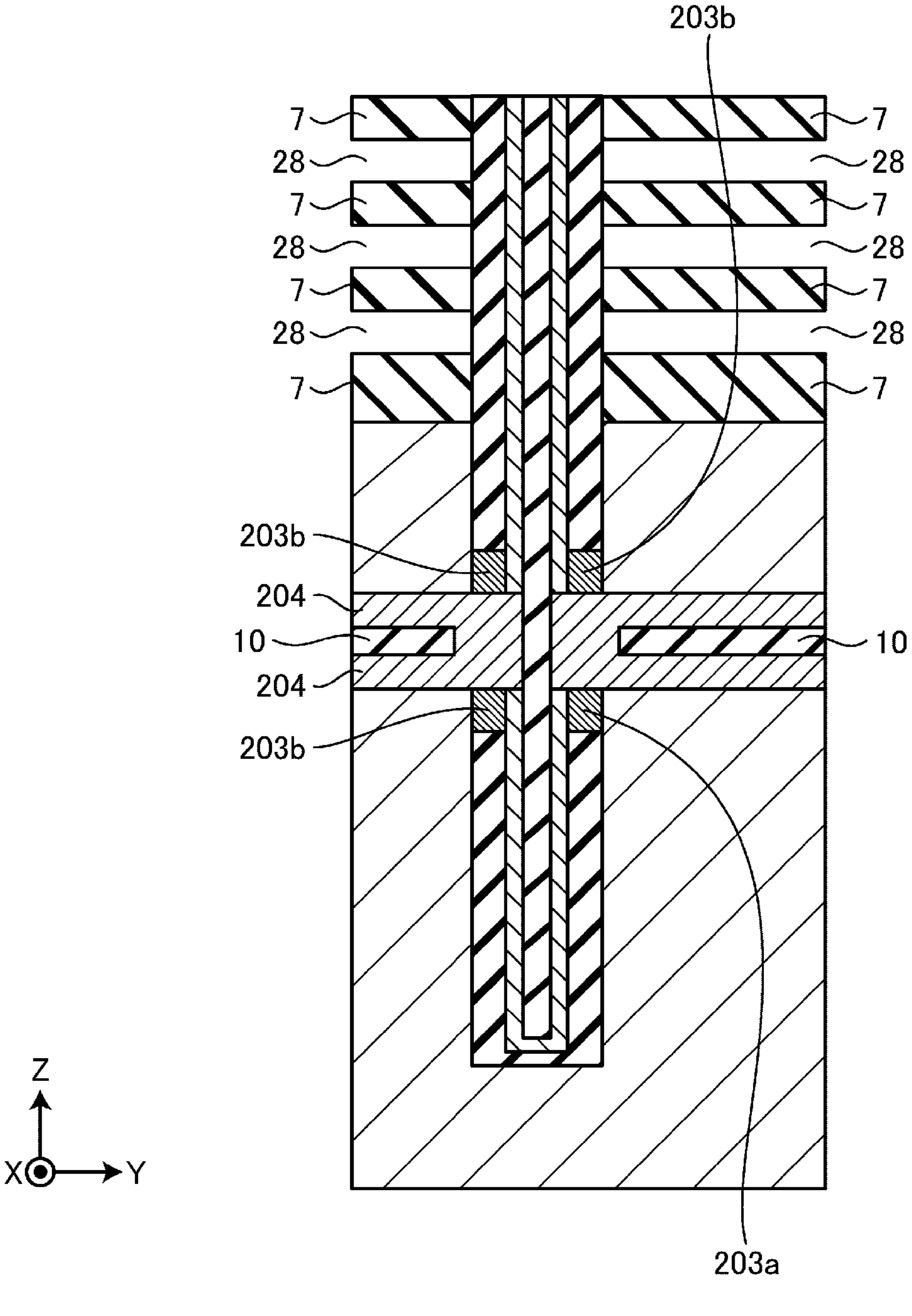

In the process shown in FIG. 28, the sacrificial layer 13 in the stacked body SST1*j* is removed by isotropic etching such as wet etching, and the void 28 is formed. Then, the insulating film 8 (see FIGS. 5A and 5B) that covers the exposed surface of the void 28 is formed. The insulating film 8 may be formed of an insulating substance such as an aluminum oxide.

In the process shown in FIG. 24, a conductive substance is embedded into the void 28, and the conductive layer 6 is formed. The conductive layer 6 is formed of a material containing a metal such as tungsten as a main component. Consequently, the stacked body SST in which the plurality of insulating layers 7 and the plurality of conductive layers 6 are alternately stacked is formed. That is, the semiconductor memory device 201 including the stacked body SST is formed.

As described above, in the third embodiment, the DSC structure in which the source line SL is in contact with the semiconductor film 42 is provided in the semiconductor memory device 201. In the DSC structure, in the conductive films 203 and 204 functioning as the source line SL, the conductive film 203*b* is in contact with each of the side surface of the semiconductor film 42 and the end portion of the conductive film 204. The conductive film 204 is not in direct contact with the side surface of the semiconductor film 42 but in direct contact with one end of the semiconductor film 42. The conductive film 204 contains a polycrystalline semiconductor containing an impurity. The conductive film 203*b* contains a polycrystalline semiconductor containing an impurity and carbon. Accordingly, the average grain size of the polycrystalline semiconductor in the conductive film 203*b* is smaller than the average grain size of the polycrystalline semiconductor in the conductive film 204. Consequently, the amount of impurities diffused from the semiconductor films 5 and 9 and the conductive film 204 to the semiconductor film 42 through the conductive film 203*b* can be properly controlled. As a result, since it is possible to improve the efficiency of GIDL generation at the select gate SGSB during the erasing operation and to properly turn on and off the select gate SGS, the operational reliability of the semiconductor memory device 201 can be improved.

In the DSC structure in which the source line SL is in contact with the semiconductor film 42, the case of impurity diffusion from the source line SL to the semiconductor film 42 differs between the structure shown in FIG. 4, the structure shown in FIG. 17, and the structure shown in FIG. 24. The case of impurity diffusion can be represented by a diffusion coefficient. The diffusion coefficient may be defined as the amount of a substance passing through a unit area per unit time.

In the structure shown in FIG. 4, the conductive film 4 is in indirect contact with one end of the semiconductor film 42 through the conductive film 3*b*. The conductive film 4 contains a polycrystalline semiconductor containing an impurity. The conductive film 3*b* contains a polycrystalline semiconductor containing an impurity and carbon. The average grain size of the polycrystalline semiconductor in the conductive film 3*b* is smaller than the average grain size of the polycrystalline semiconductor in the conductive film 4. The conductive film 3*b* functions as a film for controlling the amount of impurities diffused from the conductive film 4 to the semiconductor film 42.

In the structure shown in FIG. 4, the indirect contact area of the conductive film 4 with the semiconductor film 42 through the conductive film 3*b* is the area of one end of the semiconductor film 42 and is relatively small. Therefore, a diffusion coefficient $D_4$ of the impurity from the conductive film 4 to the semiconductor film 42 in the structure shown in FIG. 4 is relatively small.

In the structure shown in FIG. 17, the conductive film 4 is in indirect contact with the side surface of the semiconductor film 42 through the conductive film 103*c*. The conductive film 4 contains a polycrystalline semiconductor containing an impurity. The conductive film 103*c* contains a polycrystalline semiconductor containing an impurity and carbon. The average grain size of the polycrystalline semiconductor in the conductive film 103*c* is smaller than the average grain size of the polycrystalline semiconductor in the conductive film 4. The conductive film 103*c* functions as a film for controlling the amount of impurities diffused from the conductive film 4 to the semiconductor film 42.

In the structure shown in FIG. 17, the indirect contact area of the conductive film 4 with the semiconductor film 42 through the conductive film 103*c* is the area of the side surface of the semiconductor film 42 and is larger than that of the structure shown in FIG. 4. Therefore, a diffusion coefficient $D_{17}$ of the impurity from the conductive film 4 to the semiconductor film 42 in the structure shown in FIG. 17 is larger than the diffusion coefficient $D_4$ of the structure shown in FIG. 4.

In the structure shown in FIG. 24, the conductive film 204 is in direct contact with one end of the semiconductor film 42 and is in indirect contact with the side surface of the semiconductor film 42 through the conductive film 203*b*. The conductive film 204 contains a polycrystalline semiconductor containing an impurity. The conductive film 203*b* contains a polycrystalline semiconductor containing an impurity and carbon. The average grain size of the polycrystalline semiconductor in the conductive film 203*b* is smaller than the average grain size of the polycrystalline semiconductor in the conductive film 204. The conductive film 203*b* functions as a film for controlling the amount of impurities diffused from the conductive film 204 to the semiconductor film 42.

In the structure shown in FIG. 24, the conductive film 204 has a direct contact area with the semiconductor film 42 through the conductive film 203*b*. Therefore, a diffusion coefficient $D_{24}$ of the impurity from the conductive film 204 to the semiconductor film 42 in the structure shown in FIG. 24 is larger than the diffusion coefficient $D_{17}$ of the structure shown in FIG. 17.

That is, the diffusion coefficient $D_4$ of the structure shown in FIG. 4, the diffusion coefficient $D_{17}$ of the structure shown in FIG. 17, and the diffusion coefficient $D_{24}$ of the structure shown in FIG. 24 are related as follows.

$$D_4<D_{17}<D_{24}$$

As a result, the semiconductor memory device may be configured by selecting and employing any of the structure shown in FIG. 4, the structure shown in FIG. 17, and the structure shown in FIG. 24 according to the required diffusion coefficient of the impurity from the source line SL to the semiconductor film 42 in the DSC structure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
- a first conductive film;
- a semiconductor layer on the first conductive film;
- a stacked body having a plurality of conductive layers insulated from each other and stacked above the semiconductor layer in a stacking direction;
- a semiconductor film extending through the stacked body and the first conductive film in the stacking direction;
- an insulating film extending in the stacking direction between the plurality of conductive layers in the stacked body and the semiconductor film; and
- a second conductive film containing carbon, that is in direct contact with the first conductive film and with one end or a side surface of the semiconductor film.

2. The semiconductor memory device according to claim 1,
- wherein the second conductive film is in direct contact with the one end of the semiconductor film.

3. The semiconductor memory device according to claim 2, wherein the second conductive film includes
- a first surface that is in direct contact with the one end of the semiconductor film, and
- a second surface that is on a side opposite to the first surface and in direct contact with the first conductive film.

4. The semiconductor memory device according to claim 1,
- wherein the second conductive film is in direct contact with the side surface of the semiconductor film.

5. The semiconductor memory device according to claim 4, wherein the second conductive film includes
- a first side surface that is in direct contact with the side surface of the semiconductor film, and
- a second side surface that is on a side opposite to the first side surface and in direct contact with an end portion of the first conductive film.

6. The semiconductor memory device according to claim 4, wherein the second conductive film includes
- a first side surface that is in direct contact with the side surface of the semiconductor film,
- a first main surface that is in direct contact with one end of the insulating film, and
- a second main surface that is on a side opposite to the first main surface and in direct contact with an end portion of the first conductive film.

7. The semiconductor memory device according to claim 6, wherein the first conductive film is in direct contact with the one end of the semiconductor film.

8. The semiconductor memory device according to claim 1, wherein
- the first conductive film contains a polycrystalline semiconductor containing an impurity, and the second conductive film contains a polycrystalline semiconductor containing an impurity and carbon, and an average grain size of the polycrystalline semiconductor in the second conductive film is smaller than an average grain size of the polycrystalline semiconductor in the first conductive film.

9. The semiconductor memory device according to claim 8, wherein the polycrystalline semiconductor is polysilicon.

10. A semiconductor memory device comprising:

a first conductive film;

a semiconductor layer on the first conductive film;

a plurality of conductive layers insulated from each other and stacked above the semiconductor layer in a stacking direction;

a memory pillar extending through the conductive layers and the first conductive film in the stacking direction, wherein the memory pillar includes an insulating core extending in the stacking direction, a semiconductor film surrounding the insulating core and extending in the stacking direction, and an insulating film surrounding the semiconductor film and extending in the stacking direction; and a second conductive film containing carbon, that is in direct contact with the first conductive film and the semiconductor film.

11. The semiconductor memory device according to claim 10, wherein the second conductive film has a first portion that is on an upper side of the first conductive film and in direct contact with the semiconductor film and a second portion that is on a lower side of the first conductive film and in direct contact with the semiconductor film.

12. The semiconductor memory device according to claim 11, wherein the first and second portions of the second conductive film are in direct contact with a side surface of the semiconductor film.

13. The semiconductor memory device according to claim 11, wherein the semiconductor film has a first portion with which the first portion of the second conductive film is in direct contact, and a second portion with which the second portion of the second conductive film is in direct contact.

14. The semiconductor memory device according to claim 13, wherein the first portion of the second conductive film is in direct contact with a side surface of the first portion of the semiconductor film, and the second portion of the second conductive film is in direct contact with a side surface of the second portion of the semiconductor film.

15. The semiconductor memory device according to claim 13, wherein the first portion of the second conductive film is in direct contact with a lower surface of the first portion of the semiconductor film, and the second portion of the second conductive film is in direct contact with an upper surface of the second portion of the semiconductor film.

16. The semiconductor memory device according to claim 15, wherein the first conductive film is in direct contact with the insulating core.

17. The semiconductor memory device according to claim 10, wherein the first conductive film contains a polycrystalline semiconductor containing an impurity, and the second conductive film contains a polycrystalline semiconductor containing an impurity and carbon, and an average grain size of the polycrystalline semiconductor in the second conductive film is smaller than an average grain size of the polycrystalline semiconductor in the first conductive film.

18. The semiconductor memory device according to claim 17, wherein the polycrystalline semiconductor is polysilicon.

* * * * *